(12) United States Patent
Kikuchi

(10) Patent No.: US 9,261,400 B2
(45) Date of Patent: Feb. 16, 2016

(54) FOCUS DETECTION APPARATUS, ELECTRONIC APPARATUS, MANUFACTURING APPARATUS, AND MANUFACTURING METHOD

(71) Applicant: Sony Corporation, Tokyo (JP)

(72) Inventor: Koji Kikuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/290,288

(22) Filed: May 29, 2014

(65) Prior Publication Data

US 2014/0362368 A1 Dec. 11, 2014

(30) Foreign Application Priority Data

Jun. 6, 2013 (JP) ................................. 2013-119934

(51) Int. Cl.
*G01J 1/00* (2006.01)
*G02B 3/00* (2006.01)
*G02B 27/28* (2006.01)
*H01L 27/146* (2006.01)

(52) U.S. Cl.
CPC ................. *G01J 1/00* (2013.01); *G02B 3/0043* (2013.01); *G02B 27/285* (2013.01); *H01L 27/14607* (2013.01); *H01L 27/14623* (2013.01); *H01L 27/14627* (2013.01); *H01L 27/14629* (2013.01); *H01L 27/14685* (2013.01); *H01L 27/14687* (2013.01)

(58) Field of Classification Search
CPC ..................... G01N 2015/0073; G01N 15/147; G01N 2015/0088
USPC .................................. 356/345, 123, 450, 477
See application file for complete search history.

(56) References Cited

U.S. PATENT DOCUMENTS 8,698,927 B2 * 4/2014 Nagano .............. H04N 5/23212
348/294
2010/0230583 A1 * 9/2010 Nakata et al. ............... 250/227.2

FOREIGN PATENT DOCUMENTS

JP          2011-165736          8/2011

* cited by examiner

*Primary Examiner* — Gregory J Toatley
*Assistant Examiner* — Iyabo S Alli
(74) *Attorney, Agent, or Firm* — Sheridan Ross P.C.

(57) ABSTRACT

There is provided a focus detection apparatus including: microlenses; light reception units that receive light which is incident through the microlenses; waveguides that cause light, which is incident to the microlenses at a predetermined angle, to be received by the light reception units and that are provided between the microlenses and the light reception units; and a detection unit that detects focusing output values from the light reception units.

20 Claims, 21 Drawing Sheets

FOCUS DETECTION APPARATUS, ELECTRONIC APPARATUS, MANUFACTURING APPARATUS, AND MANUFACTURING METHOD

CROSS REFERENCE TO RELATED APPLICATIONS

This application claims the benefit of Japanese Priority Patent Application JP 2013-119934 filed Jun. 6, 2013, the entire contents of which are incorporated herein by reference.

BACKGROUND

The present disclosure relates to a focus detection apparatus, an electronic apparatus, a manufacturing apparatus, and a manufacturing method. In particular, the present disclosure relates to a focus detection apparatus which detects focus with higher accuracy, an electronic apparatus, a manufacturing apparatus, and a manufacturing method.

Autofocus methods of a digital camera mainly include a contrast method and a phase difference method. The contrast method is a method of moving a lens and considering a location, the contrast of which is the highest, as a focused location. In a case of a digital camera, it is possible to realize autofocusing in such a way that an imaging element reads a part of an image, and another optical system for autofocusing is not necessary.

The phase difference method is a method to which a so-called triangulation technology is applied, that is, a method of acquiring a distance using an angular difference obtained when one subject is viewed from two different points. In a case of the phase difference method, images formed by light which passes through different parts of a lens, for example, flux of light of each of the right side and the left side of the lens is used. In the phase difference method, the amount of movement of the lens to a focused location is acquired by measuring the distance.

In image plane phase difference autofocusing, autofocusing is performed using the phase difference method with an imaging element. The imaging element is provided with a converging microlens. It is possible to use an imaging element for phase difference autofocusing by adding a diaphragm member which restricts incident light to the microlens (for example, refer to Japanese Unexamined Patent Application Publication No. 2011-165736).

SUMMARY

In a case of the contrast method, it is necessary to move a lens back and forth in order to search for a location, the contrast of which is the highest, and thus there is a case in which it takes a time until being focused. Compared to the contrast method, time taken to move the lens back and forth in order to search for a focal location is not necessary in the phase difference method, and thus it is possible to realize high-speed autofocusing.

However, in the image plane phase difference method, a diaphragm member that restricts incident light to a microlens, for example, a light shield film is provided, with the result that the quantity of light which is incident to the imaging element is restricted, and thus sensitivity deteriorates. That is, in the image plane phase difference method, light flux of, for example, each of the right side and the left side of the lens is used and a part of light which is incident to the lens is used, with the result that the quantity of light which is incident to the imaging element decreases, and thus sensitivity deteriorates.

In addition, in the image plane phase difference method, light flux of, for example, each of the right side and the left side of the lens is used, and thus it is necessary that light which passes through the right side of the lens is incident to a right-side imaging element and light which passes through the left side of the lens is incident to a left-side imaging element. In other words, it is necessary to perform control such that light which passes through the left side of the lens is not incident to the imaging element for the right side and that light which passes through the right side of the lens is not incident to the imaging element for the left side.

Japanese Unexamined Patent Application Publication No. 2011-165736 discloses that unnecessary light is reflected using a reflective plate in order to perform control such that light which passes through the left side of the lens is not incident to the imaging element for the right side and that light which passes through the right side of the lens is not incident to the imaging element for the left side. However, even in Japanese Unexamined Patent Application Publication No. 2011-165736, the quantity of light which is incident to the imaging element decreases, and thus sensitivity deteriorates.

It is desirable to detect focusing with enhanced accuracy.

According to an embodiment of the present disclosure, there is provided a focus detection apparatus including: microlenses; light reception units that receive light which is incident through the microlenses; waveguides that cause light, which is incident to the microlenses at a predetermined angle, to be received by the light reception units and that are provided between the microlenses and the light reception units; and a detection unit that detects focusing output values from the light reception units.

The waveguides may have an asymmetrical shape, a part of which includes a slope of a side wall according to light reception angle.

The waveguides may be respectively provided to the continuous light reception units, and a light shield film may be provided at a central part between the waveguides.

The microlenses may be arranged at locations that are disposed over the continuous light reception units.

An inside and an outside of the waveguide may be formed of different materials, and a difference between a refractive index of the material of the inside and a refractive index of the material of the outside may be equal to or greater than 0.2.

The waveguides may be configured to include reflective plates that reflect light which is incident at a predetermined angle or greater.

The microlenses that are arranged on the waveguides may be configured to have lower lens power than the microlenses which are not arranged on the waveguides.

A difference in the refractive indexes of the materials which form the reflective plates may be equal to or greater than 0.2.

The focus detection apparatus according to the embodiment of the present disclosure may include the waveguides that cause light, which is incident to the microlenses at a predetermined angle, to be received by the light reception units and that are provided between the microlenses and the light reception units.

According to another embodiment of the present disclosure, there is provided an electronic apparatus including: microlenses; light reception units that receive light which is incident through the microlenses; waveguides that cause light, which is incident to the microlenses at a predetermined angle, to be received by the light reception units and that are provided between the microlenses and the light reception units; a detection unit that detects focusing signals from the light reception units which are provided with the waveguides; and a signal processing unit that performs a signal process on signals output from the light reception units which are not provided with the waveguides.

The electronic apparatus according to the embodiment of the present disclosure may include the waveguides that cause light, which is incident to the microlenses at a predetermined angle, to be received by the light reception units and that are provided between the microlenses and the light reception units, and focusing may be detected from the signals which are received by the light reception units through the waveguides.

According to yet another embodiment of the present disclosure, there is provided a manufacturing apparatus which manufactures a focus detection apparatus including: microlenses; light reception units that receive light which is incident through the microlenses; waveguides that cause light, which is incident to the microlenses at a predetermined angle, to be received by the light reception units and that are provided between the microlenses and the light reception units; and a detection unit that detects focusing output values from the light reception units.

The waveguides may be manufactured by repeating a lithography process, a dry etching process, and a process of implanting materials which form the waveguides a plurality of times.

According to still another embodiment of the present disclosure, there is provided a method of manufacturing a focus detection apparatus, the apparatus including: microlenses; light reception units that receive light which is incident through the microlenses; waveguides that cause light, which is incident to the microlenses at a predetermined angle, to be received by the light reception units and that are provided between the microlenses and the light reception units; and a detection unit that detects focusing output values from the light reception units.

The waveguides may be manufactured by repeating a lithography process, a dry etching process, and a process of implanting materials which form the waveguides a plurality of times.

In the manufacturing apparatus and the manufacturing method according to the embodiments of the present disclosure, the focus detection apparatus including the waveguides that cause light, which is incident to the microlenses at a predetermined angle, to be received by the light reception units and that are provided between the microlenses and the light reception units may be manufactured.

According to the embodiments of the present disclosure, it is possible to detect focusing with enhanced accuracy.

DETAILED DESCRIPTION OF EMBODIMENTS

Hereinafter, forms (hereinafter, referred to as embodiments) to realize the present disclosure will be described. Further, the description will be made in the following order.
1. Configuration of Imaging Device
2. Configuration of Imaging Element
3. Autofocus according to Image Plane Phase Difference Method
4. Configuration of Focus Detection Apparatus According To First Embodiment
5. Setting of Each of Units of Focus Detection Apparatus According To First Embodiment
6. Configuration of Focus Detection Apparatus according to Second Embodiment
7. Setting of Each of Units of Focus Detection Apparatus According To Second Embodiment
8. Manufacture
Configuration of Imaging Device It is possible to apply the present disclosure which will be described below to an autofocus device such as a digital camera. In addition, although autofocus methods mainly include a contrast method and a phase difference method, the present disclosure can be applied to the phase difference method, and image plane phase difference autofocusing will be described as an example in the description below.

It is possible to apply the image plane phase difference autofocusing to overall electronic apparatus in which a semiconductor package is used for an image capture unit (photoelectric conversion unit), for example, an imaging device, such as a digital still camera or a video camera, a portable terminal apparatus, such as a portable phone, which includes an imaging function, and a copying machine in which an imaging device is used for an image reading unit.

Figure 1:
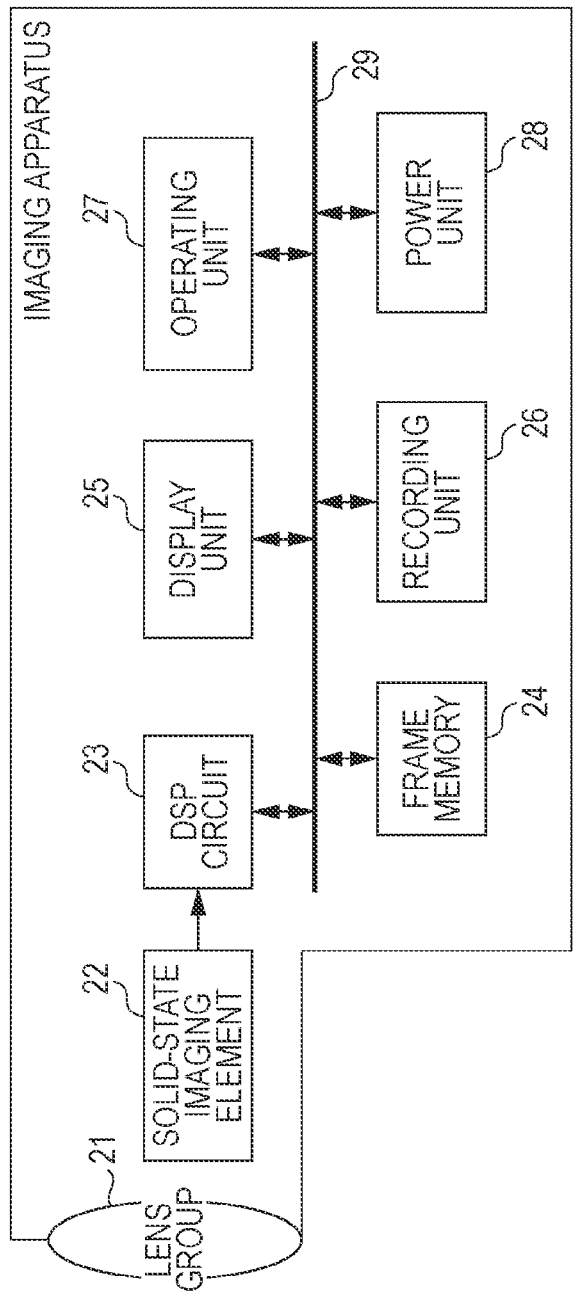
FIG. 1 is a diagram illustrating the configuration of an imaging device.

FIG. 1 is a block diagram illustrating an example of the configuration of an electronic apparatus according to an embodiment of the present disclosure, for example, an imaging device. As shown in FIG. 1, an imaging device 10 according to the embodiment of the present disclosure includes an optical system which includes a lens group 21, a solid-state imaging element (imaging device) 22, a Digital Signal Processor (DSP) circuit 23, a frame memory 24, a display unit 25, a recording unit 26, an operating unit 27, a power unit 28, and the like. Further, the DSP circuit 23, the frame memory 24, the display unit 25, the recording unit 26, the operating unit 27, and the power unit 28 are connected to each other through a bus line 29.

The lens group 21 takes incident light (image light) from a subject and images the incident light onto the imaging surface of the solid-state imaging element 22. The solid-state imaging element 22 converts the quantity of the incident light that is imaged onto the imaging surface by the lens group 21 into an electrical signal in units of a pixel, and outputs the electrical signal as a pixel signal.

The DSP circuit 23 processes the signal from the solid-state imaging element 22. For example, although the details will be described later, the solid-state imaging element 22 includes pixels for detecting focusing, and processes signals from the pixels, thereby performing a process of detecting focusing. In addition, the solid-state imaging element 22 includes pixels for establishing the images of a captured subject, processes signals from the pixels, and performs a process to develop the pixels in the frame memory 24.

The display unit 25 includes a panel-type display apparatus, such as a liquid crystal display apparatus or an organic Electro Luminescence (EL) display apparatus, and displays moving or still pictures which are imaged by the solid-state imaging element 22. The recording unit 26 records the moving or still pictures which are imaged by the solid-state imaging element 22 in a recording medium such as a video tape or a Digital Versatile Disc (DVD).

The operating unit 27 generates operating instructions with regard to various functions, which are included in the imaging device, under operations performed by a user. The power unit 28 appropriately supplies various types of power which becomes operation power for the DSP circuit 23, the frame memory 24, the display unit 25, the recording unit 26 and the operating unit 27 to such supply targets.

It is possible to use the imaging device, which includes the above-described configuration, as an imaging device of a camera module for a mobile device, such as a video camera, a digital still camera, or a mobile phone. Further, in the imaging device, it is possible to use a semiconductor package that includes phase difference pixels which will be described later as the solid-state imaging element 22.

Configuration of Imaging Element

Figure 2:
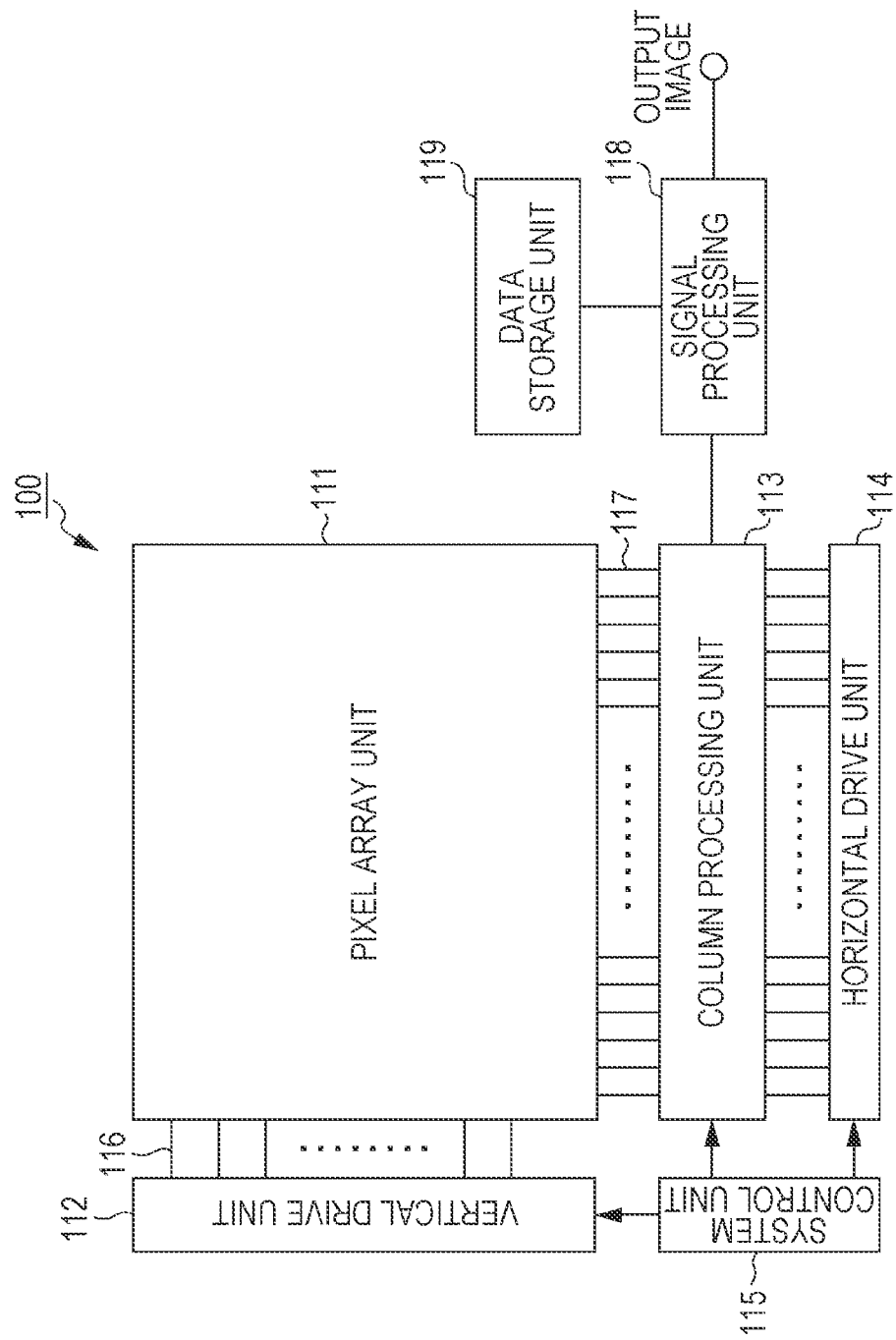
FIG. 2 is a diagram illustrating the configuration of a solid-state imaging element.

FIG. 2 is a diagram illustrating the configuration of the solid-state imaging element 22, and is a system configuration diagram illustrating the outline of the configuration of, for example, a CMOS image sensor which is a kind of an X-Y address type imaging device. Here, the CMOS image sensor is an image sensor which is prepared by applying a CMOS process or partially using the CMOS process.

The CMOS image sensor 100 shown in FIG. 2 is configured to include a pixel array unit 111 that is formed on a semiconductor substrate which is not shown in the drawing, and peripheral circuit units that are integrated on the semiconductor substrate similarly to the pixel array unit 111. The peripheral circuit units are configured to include, for example, a vertical drive unit 112, a column processing unit 113, a horizontal drive unit 114 and a system control unit 115.

The CMOS image sensor 100 further includes a signal processing unit 118 and a data storage unit 119. The signal processing unit 118 and the data storage unit 119 may be mounted on the same substrate as the CMOS image sensor 100 or may be mounted on a substrate which is different from the substrate of the CMOS image sensor 100. In addition, each of the processes of the signal processing unit 118 and the data storage unit 119 may be processed by an external signal processing unit, for example, a Digital Signal Processor (DSP) circuit or software, which is provided on a separate substrate from that of the CMOS image sensor 100.

The pixel array unit 111 includes a configuration in which unit pixels (hereinafter, there are cases simply being described as "pixels") that include photoelectric conversion units for generating and storing photocharge according to the quantity of received light are arranged in a row direction and a column direction, that is, two-dimensionally arranged in a matrix shape. Here, the row direction refers to the pixel arrangement direction (that is, a horizontal direction) of a pixel row, and the column direction refers to the pixel arrangement direction of a pixel column (that is, a vertical direction).

With regard to the matrix-shaped pixel arrangement in the pixel array unit 111, pixel drive lines 116 are arranged for the respective pixel rows along the row direction, and vertical signal lines 117 are arranged for the respective pixel columns along the column direction. The pixel drive lines 116 transmit drive signals for performing drive when signals are read from the pixels. In FIG. 1, a single wiring is shown with regard to the pixel drive lines 116. However, the pixel drive lines 116 are not limited to the single line. One ends of the pixel drive lines 116 are connected to output ends which correspond to the respective rows of the vertical drive unit 112.

The vertical drive unit 112 is configured to include a shift register and an address decoder, and drives each of the pixels of the pixel array unit 111 at the same time for all pixels or in units of a row. That is, the vertical drive unit 112 forms a drive unit that drives each of the pixels of the pixel array unit 111, together with the system control unit 115 which controls the vertical drive unit 112. Although the detailed configuration of the vertical drive unit 112 is not shown in the drawing, the vertical drive unit 112 is generally configured to include two scan systems, that is, a read scan system and a sweep scan system.

The read scan system selectively scans the unit pixels of the pixel array unit 111 sequentially in row units in order to read signals from the unit pixels. The signals which are read from the unit pixels are analog signals. The sweep scan system performs sweep scan on read rows, on which the read scan is performed by the read scan system, prior to the read scan by a shutter speed time.

When the sweep scan is performed by the sweep scan system, the photoelectric conversion units are reset in such a way that unnecessary charges are swept out from the photoelectric conversion units of the unit pixels in the read row. Further, when unnecessary charges are swept out (reset) by the sweep scan system, a so-called electronic shutter operation is performed. Here, the electronic shutter operation is an operation to discard the photocharges of the photoelectric conversion units and to start new exposure (start accumulation of the photocharges).

Signals, which are read through the read operation performed by the read scan system, correspond to the quantity of light which is received immediately before the read operation or after the electronic shutter operation is performed. Further, a period from a read timing acquired through the immediately before read operation or a sweep timing acquired through the electronic shutter operation to a read timing acquired through a current read operation is an exposure period of the photo-charges in the unit pixels.

Signals, which are output from the respective unit pixels in the pixel rows that are selectively scanned by the vertical drive unit 112, are input to the column processing unit 113 through the respective vertical signal lines 117 for the respective pixel columns. The column processing unit 113 performs a predetermined signal process on the signals which are output from the respective pixels in the selected rows through the vertical signal lines 117 for the respective pixel columns of the pixel array unit 111, and temporarily maintains pixel signals acquired after the signal process is performed.

More specifically, the column processing unit 113 performs at least a noise removing process, for example, a Correlated Double Sampling (CDS) process as the signal process. When the CDS process is performed by the column processing unit 113, fixed pattern noise, which is unique to a pixel, such as reset noise or the threshold variation of an amplification transistor in the pixel, is removed. It is possible to convert an analog pixel signal into a digital signal and to output a resulting signal by adding, for example, an Analog-Digital (AD) conversion function to the column processing unit 113 in addition to the noise removing process.

The horizontal drive unit 114 is configured to include a shift register, an address decoder, and the like, and sequentially selects a unit circuit corresponding to the pixel column of the column processing unit 113. When the selective scan is performed by the horizontal drive unit 114, a pixel signal, on which the signal process is performed for each unit circuit, of the column processing unit 113 is sequentially output.

The system control unit 115 is configured to include a timing generator, which generates various timing signals, and the like, and performs drive control on the vertical drive unit 112, the column processing unit 113, the horizontal drive unit 114, and the like based on the various timings signals which are generated by the timing generator.

The signal processing unit 118 includes at least an arithmetic processing function, and performs various signal processes, such as an operation process, on the pixel signals which are output from the column processing unit 113. The data storage unit 119 temporarily stores data which is necessary for the signal process performed by the signal processing unit 118.

Figure 3:
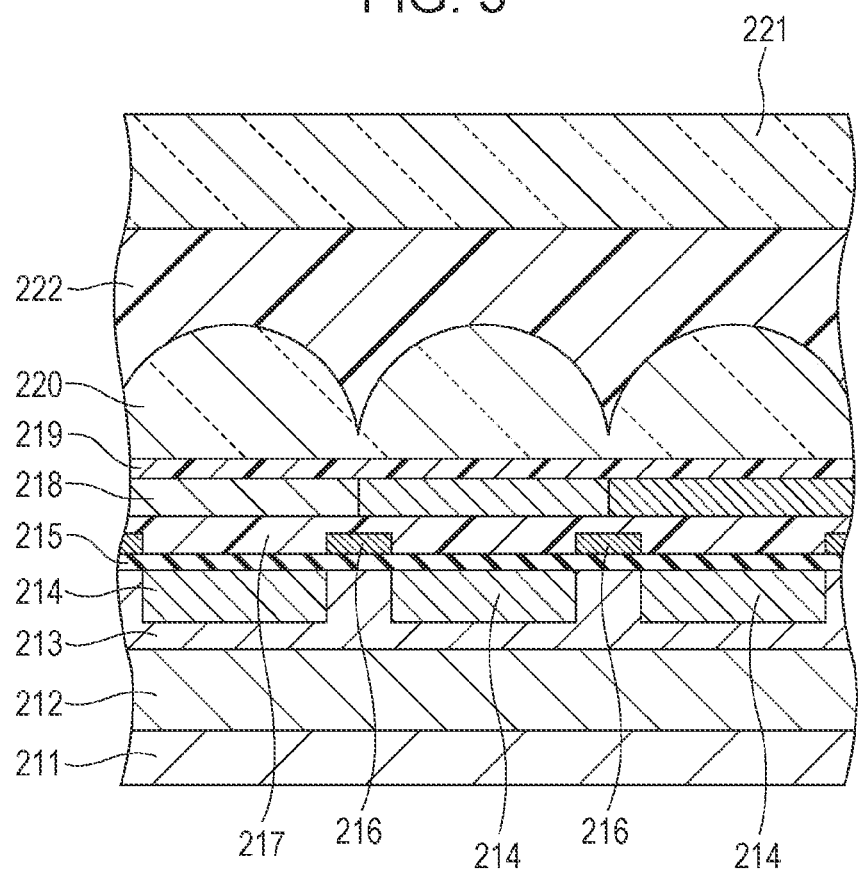
FIG. 3 is a diagram illustrating the configuration of a semiconductor package.

FIG. 3 is a cross-sectional diagram schematically illustrating the basic configuration of the semiconductor package which is included in the CMOS image sensor 100 in FIG. 2, which is the imaging device to which the present disclosure is applied. A semiconductor package 200 in FIG. 3 forms a backside irradiation-type CMOS image sensor.

In the semiconductor package 200 in an available pixel area shown in FIG. 3, a wire layer 212 which is formed of $SiO_2$ is formed on a support substrate 211, and a silicon substrate 213 is formed on the wire layer 212. Silicon, glass epoxy, glass, plastic, or the like is used for the support substrate 211. A plurality of photodiodes 214 (optical elements) are formed on the surface of the silicon substrate 213 as the photoelectric conversion units of the respective pixels at predetermined intervals.

A protection film 215 which is formed of $SiO_2$ is formed on the silicon substrate 213 and the photodiodes 214. Light shield films 216 are formed on the protection film 215 between the adjacent photodiodes 214 in order to prevent leaking of light to the adjacent pixels. Meanwhile, although the light shield films 216 are provided in order to prevent the leaking of light to the adjacent pixels, the light shield films 216 are provided in order to prevent excessive light from being incident to pixels for focus detection as will be described later.

A flattening film 217 is provided on the protection film 215 and the light shield films 216 in order to flatten an area in which color filters are formed. A color filter layer 218 is formed on the flattening film 217. In the color filter layer 218, a plurality of color filters are provided for the respective pixels, and the colors of the respective color filters are arranged in, for example, a Bayer array.

A first organic material layer 219 is formed on the color filter layer 218. An acrylic resin material, a styrene resin material, an epoxy resin material, or the like is used for the first organic material layer 219. Microlenses 220 are formed on the first organic material layer 219. As described above, the microlenses 220 are formed on the substrate which includes a plurality of layers including the photodiodes 214. With regard to the microlenses 220, microlenses which collect light on the photodiodes 214 of the respective pixels are formed for the respective pixels. The microlenses 220 correspond to an inorganic material layer, and SiN, SiO, or SiOxNy (where $0<x\leq1$ and $0<y\leq1$) are used therefor.

A cover glass 221 is bonded to the upper parts of microlenses 220 through a second organic material layer 222. The cover glass 221 is not limited to glass, and a transparent plate, such as resin, may be used. A protection film may be formed between the microlenses 220 and the cover glass 221 in order to prevent moisture or impurities from permeating. An acrylic resin material, a styrene resin material, an epoxy resin material, or the like is used for the second organic material layer 222 similarly to the first organic material layer 219.

Meanwhile, the configuration shown in FIG. 3 is an example. Further, it is possible to apply the present disclosure, which will be described below, to another configuration, for example, a configuration in which other layers are added to the above respective layers or in which any of the above layers is removed.

Autofocusing Using Image Plane Phase Difference Method

Figure 4:
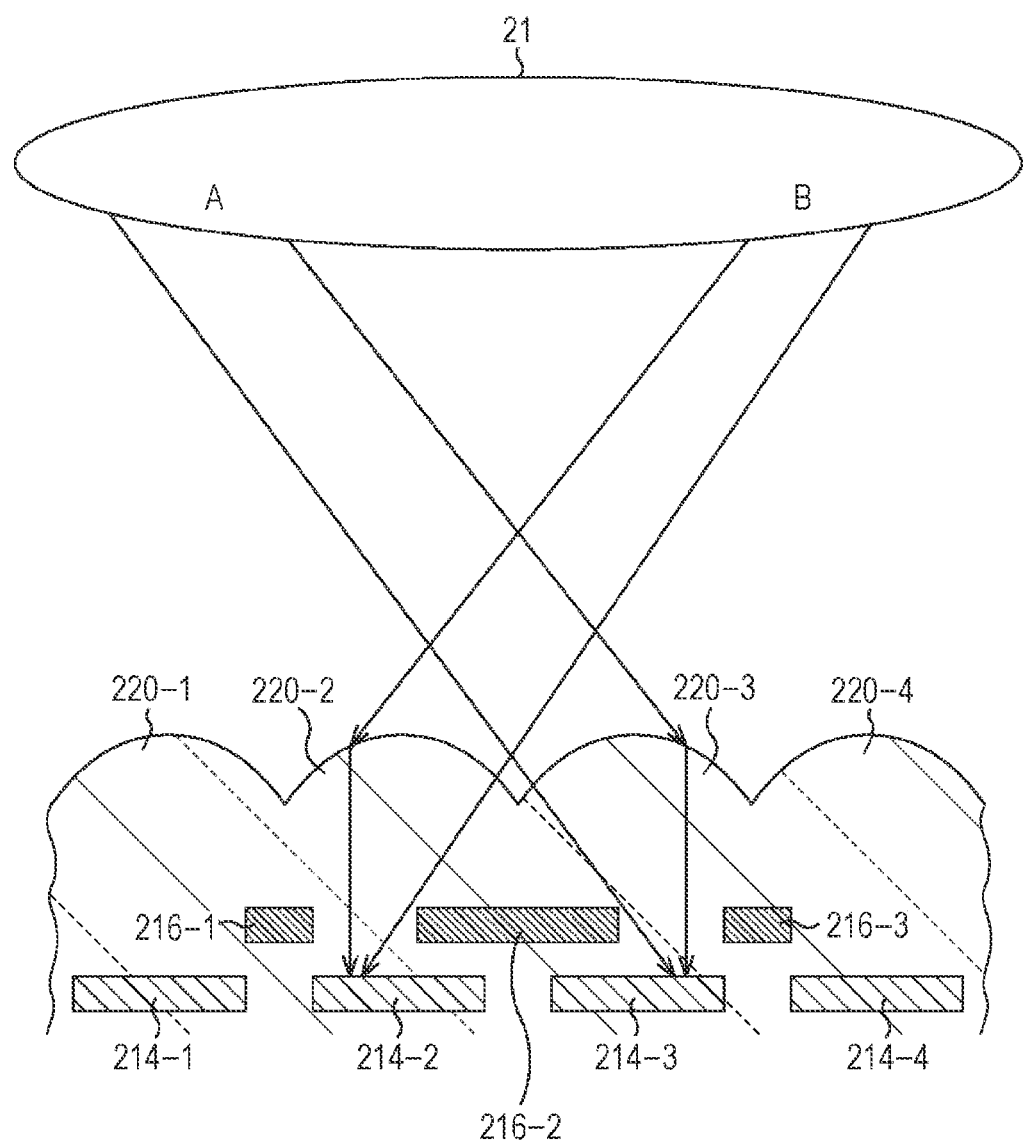
FIG. 4 is a diagram illustrating focus detection in a phase difference method.

FIG. 4 is a diagram illustrating the image plane phase difference autofocusing. A predetermined number of pixels in the pixel array unit 111, in which the pixels are 2-dimensionally arranged in a matrix shape, are assigned as phase difference pixels. A plurality of phase difference pixels are provided at predetermined locations in the pixel array unit 111.

The configuration of the phase difference pixels in FIG. 4 is a part of the solid-state imaging element 22 shown in FIGS. 2 and 3, and FIG. 4 is a diagram illustrating a part which includes the phase difference pixels and a diagram illustrating necessary parts which are extracted for the description below. Hereinafter, an apparatus, which includes phase difference pixels and includes a part that performs focus detection, is appropriately described as a focus detection apparatus.

In addition, it is assumed that the phase difference pixels are pixels used when focusing is detected using the phase difference method and that imaging pixels are pixels which are different from the phase difference pixels and are used for imaging.

The focus detection apparatus shown in FIG. 4 is configured to include a lens group 21, microlenses 220-1 to 220-4, light shield films 216-1 to 216-3, and photodiodes 214-1 to 214-4.

In the solid-state imaging element shown in FIG. 4, the photodiode 214-2 and the photodiode 214-3 function as the phase difference pixels and are assumed to be pixels for acquiring image signals in order to perform autofocusing (focus detection). The photodiode 214-1 and the photodiode 214-4, which are arranged at locations interposing the photodiode 214-2 and the photodiode 214-3 therebetween, are used as the imaging pixels and are assumed to be pixels for acquiring image signals based on light from a subject.

The photodiode 214-1 is configured to receive light from the subject which is converged by the microlens 220-1, the photodiode 214-2 is configured to receive light from the subject which is converged by the microlens 220-2, the photodiode 214-3 is configured to receive light from the subject which is converged by the microlens 220-3, and the photodiode 214-4 is configured to receive light from the subject which is converged by the microlens 220-4.

The light shield film 216-1 is provided such that light from the microlens 220-1 is not incident to the photodiode 214-2 and light from the microlens 220-2 is not incident to the photodiode 214-1. Similarly, the light shield film 216-3 is provided such that light from the microlens 220-4 is not incident to the photodiode 214-3 and light from the microlens 220-3 is not incident to the photodiode 214-4.

As described above, since the light shield film 216-1 and the light shield film 216-3 are provided to prevent leaking light with regard to adjacent pixels (photodiodes), the light shield film 216-1 and the light shield film 216-3 are provided between the adjacent photodiodes 214. With regard to the light shield films 216, the light shield film 216-3 includes a function in order to realize a function (hereinafter, described as separation capacity) of selecting the incident angle of light and receiving light in addition to the function of preventing leaking light with regard to the adjacent pixels (photodiodes).

That is, as shown in FIG. 4, the light shield film 216-2 is provided from approximately the center of the photodiode 214-2 to approximately the center of the photodiode 214-3 such that light which passes through the A side (left side of the drawing) of the lens group 21 is incident to the photodiode 214-3, and light which passes through the B side (right side of the drawing) of the lens group 21 is incident to the photodiode 214-2.

Figure 5:
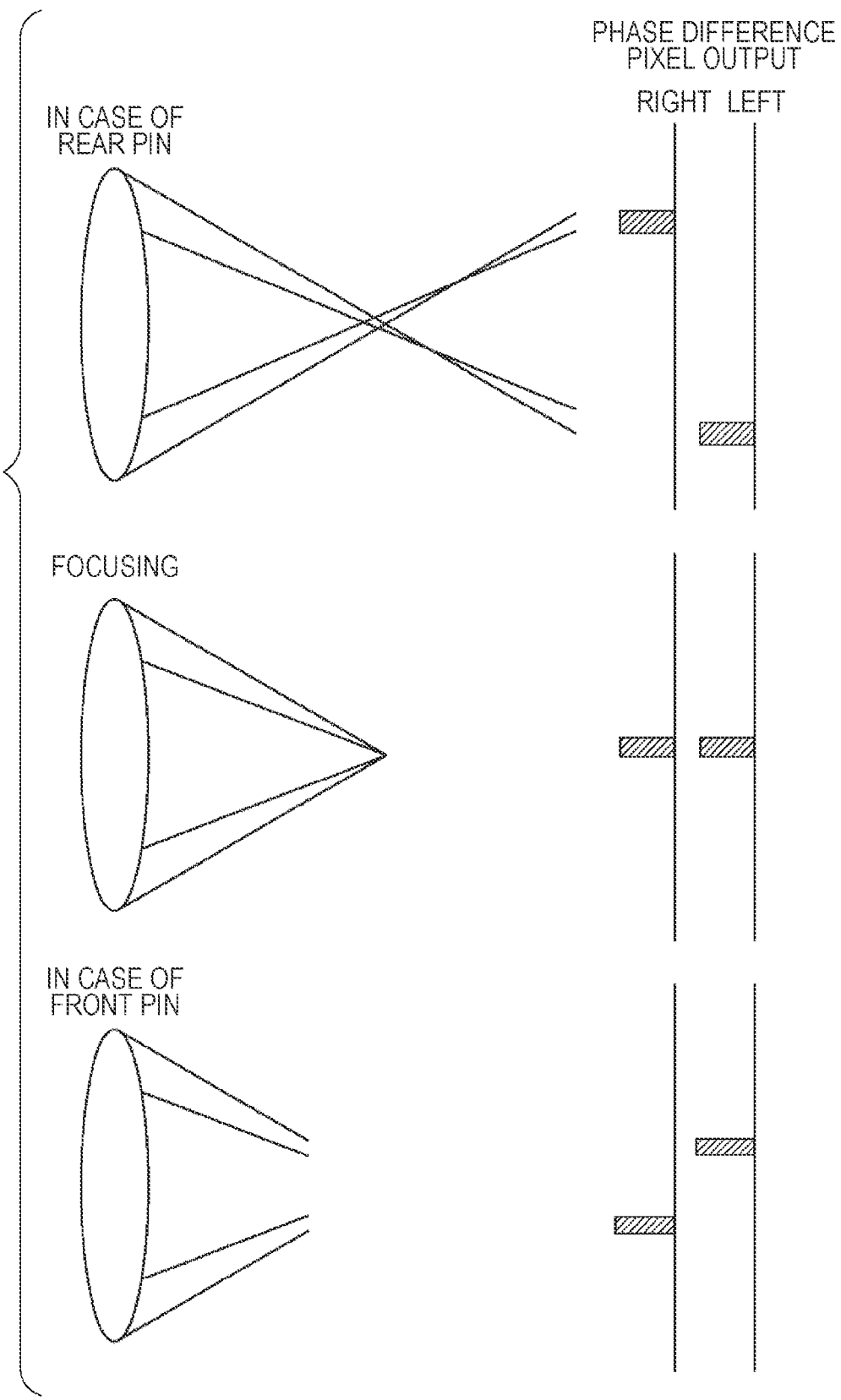
FIG. 5 is a diagram illustrating the focus detection in the phase difference method.

When the light shield film 216-2 is present, it is possible to receive light in such a way as to separate light, which is incident from the left part of the lens group 21, from light, which is incident from the right part of the lens group 21. When light, which is incident from the left part of the lens group 21, is received by the photodiode 214-2 and light, which is incident from the right part of the lens group 21, is received by the photodiode 214-3, respectively, it is possible to detect a focal location as shown in FIG. 5.

That is, in cases of a rear pin and a front pin, output from the photodiode 214-2 does not coincide with output from the photodiode 214-3 (outputs of a pair of phase difference pixels do not coincide with each other). However, in case of focusing, the output from the photodiode 214-2 coincides with the output from the photodiode 214-3 (outputs of the pair of phase difference pixel coincide with each other). When it is determined to be the rear pin or the front pin, focus detection is realized by moving the lens group 21 to a focal location.

When the focal location is detected using the phase difference method, it is possible to detect a focal location at a relatively high speed, and thus it is possible to realize high-speed autofocusing. However, there is a possibility of accompanying reduction in sensitivity. For example, there is a possibility that there may be a case in which it is difficult to detect a focal location in a dark place.

With reference to FIG. 4, the light shield film 216-2 is provided up to the central part of the photodiode 214-2. When compared to the photodiode 214-1, a state is acquired in which the light shield film does not reach the photodiode 214-1 but the light shield film reaches to the central part of the photodiode 214-2. When the quantity of light which is incident to the photodiode 214-1 is compared with the quantity of light which is incident to the photodiode 214-2, the quantity of light of the photodiode 214-1 is greater than the quantity of light of the photodiode 214-2.

Therefore, the sensitivity of the photodiode 214-1 is higher than the sensitivity of the photodiode 214-2. As described above, the sensitivity of the photodiode 214-2 is reduced due to the influence of the light shield film 216-2 which is provided to include the separation capacity. In addition, accompanying multi-pixels, there is a tendency for the size of a single pixel to be reduced, and thus the sensitivity is reduced due to the reduction in size. From this, there is a high possibility that the sensitivity of the photodiode 214-2 is reduced. The possibility is the same as that in the photodiode 214-3 which functions as the phase difference pixel.

When compared to a normal pixel, the sensitivity of the phase difference pixel is reduced because of light shading, the influence of the reduction in the pixel size is high, and thus there is a possibility that the accuracy of detection of a focal location is reduced. There is a possibility that reduction in the size of pixels may cause deterioration of the separation capacity. Therefore, if the separation capacity is not provided, there is a possibility that it may be difficult to realize focus detection using image plane phase difference.

Here, it is desirable to include the separation capacity without reducing the sensitivity of the phase difference pixels. Here, phase difference pixels which include the separation capacity without reducing the sensitivity of the phase difference pixels will be described below.

Configuration of Focus Detection Apparatus According to First Embodiment

Figure 6:
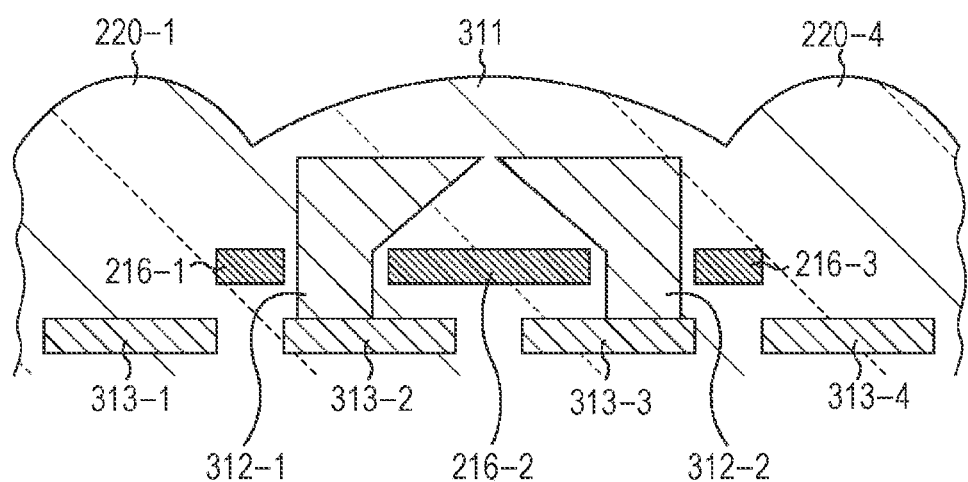
FIG. 6 is a diagram illustrating the configuration of a focus detection apparatus according to a first embodiment to which the disclosure is applied.

FIG. 6 is a diagram illustrating the configuration of a focus detection apparatus according to a first embodiment. In the focus detection apparatus shown in FIG. 6, the same reference numerals refer to the same components as those of the focus detection apparatus shown in FIG. 4, and the description thereof will not be repeated.

In the focus detection apparatus shown in FIG. 6, a photodiode 313-2 and a photodiode 313-3 are the phase difference pixels, and a photodiode 313-1 and a photodiode 313-4 are the imaging pixels.

In the focus detection apparatus shown in FIG. 6, a microlens on the photodiode 313-2 and the photodiode 313-3, which function as the phase difference pixels, is configured to include a single microlens 311. That is, the microlens 311 is a lens for two pixels.

The photodiode 313-1 and the photodiode 313-4 which are the imaging pixels are respectively provided with a microlens 220-1 and a microlens 220-4. In contrast, the photodiode 313-2 and the photodiode 313-3 which are the phase difference pixels are provided with the microlens 311 which is commonly used therefor.

Figure 7A:
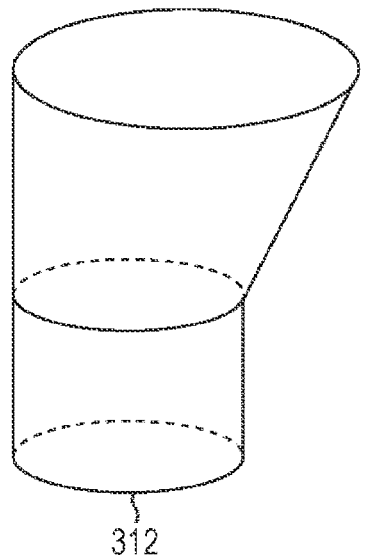
FIGS. 7A and 7B are diagrams illustrating the shapes of branched type waveguides.

The phase difference pixels are provided with branched type waveguides. The photodiode 313-2 is provided with a branched type waveguide 312-1, and the photodiode 313-3 is provided with a branched type waveguide 312-2. The branched type waveguide 312 has a structure in which light is converged according to an incident angle and reaches the photodiode 313. As shown in FIG. 7A, the branched type waveguide 312 is configured to include a lower side part which is a cylinder. The upper side part thereof has a shape in which the cylinder of the lower side part gradually spreads. When viewed from a cross section, the upper side part has a shape in which one side (right side in the drawing) is an oblique side and the other side (left side in the drawing) is a vertical side.

Figure 7B:
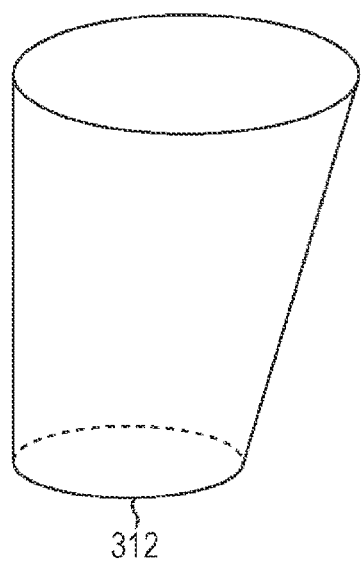

The shape of the branched type waveguide 312 shown in FIGS. 6 and 7A is an example, and the present disclosure is not limited thereto. For example, although the example shown in FIG. 7A has a shape in which it is possible to mainly separate the lower side part from the upper side part, an integral shape as shown in FIG. 7B is possible. The shape of the branched type waveguide 312 shown in FIG. 7B is a shape in which a part of a cone is cut. When viewed from the cross section, one side thereof (left side in the drawing) is provided in a vertical direction with regard to a bottom surface, and the other side (right side in the drawing) is provided to have a predetermined inclination with regard to the bottom surface.

As above, the branched type waveguide 312 has an asymmetrical shape, a part of which has the slope of a side wall according to a light reception angle. Since the branched type waveguide 312 has the shape, a part of which has the slope of the side wall according to the light reception angle, the branched type waveguide 312 has a shape which enables the photodiode 313 to selectively receive light which is incident from the right side or the left side.

Although any shape may be used as the shape of the branched type waveguide 312, it is preferable to have a shape in which the opening part of the side of the microlens 311 is greater than the opening part of the side of the photodiode 313 (light reception unit).

Figure 8:
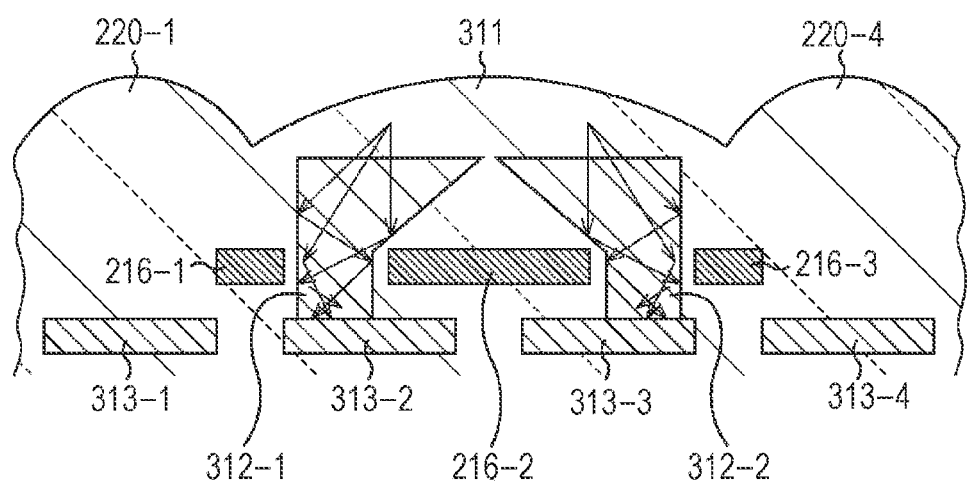
FIG. 8 is a diagram illustrating the convergence of light in the branched type waveguides.

When the branched type waveguide 312 which has such a shape is provided between the photodiode 313 and the microlens 311, light which is incident to the microlens 311 at a predetermined angle is guided by the branched type waveguide 312 and supplied to the photodiode 313, as shown in FIG. 8.

As above, light which is incident from a predetermined angle is converged by the branched type waveguide 312 and is supplied to the photodiode 313. Therefore, it is possible to prevent the sensitivity of the photodiode 313 from being reduced. With regard to this, description will be performed with reference to a graph shown in FIG. 9.

Figure 9:
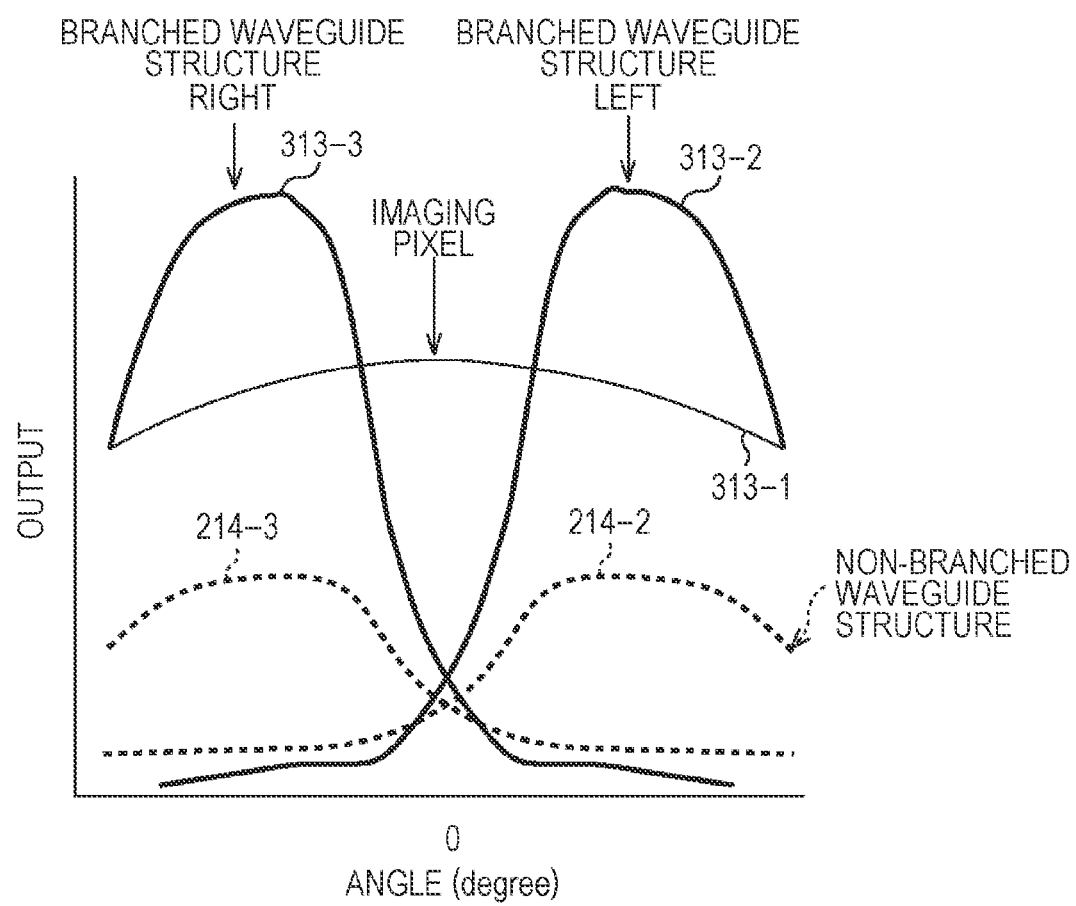
FIG. 9 is a graph illustrating the properties of phase difference pixels which include the branched type waveguides.

In the graph shown in FIG. 9, a horizontal axis indicates the incident angle of light, and a vertical axis indicates the output value of a pixel according to incident light. In FIG. 9, graphs shown by dotted lines indicate phase difference pixels which do not include the branched type waveguide 312, for example, the output values of the photodiode 214-2 and the photodiode 214-3 shown in FIG. 4. In addition, a graph shown by a narrow solid line in FIG. 9 indicates an imaging pixel, for example, the output value of the photodiode 313-1 shown in FIG. 8. In addition, graphs shown by thick solid lines in FIG. 9 indicate the phase difference pixels which include the branched type waveguide 312, for example, the output values of the photodiode 313-2 and the photodiode 313-3 shown in FIG. 8.

In FIG. 9, the graphs of the phase difference pixels which are shown by the thick solid lines and which include the branched type waveguides 312, the graphs of the phase difference pixels which are shown by the narrow solid lines and do not include the branched type waveguides 312, and the graph of the imaging pixel will be compared with each other. The graph of the imaging pixel has a maximum value when the incident angle of light is 0 degrees. In contrast, the graphs of the phase difference pixels which include the branched type waveguides 312 and the graph of the phase difference pixels which do not include the branched type waveguides 312 have a maximum value in ranges where the incident angle is not 0 degrees.

In other words, the imaging pixel has an output which does not greatly change regardless of the incident angle of light. However, the phase difference pixels depend on the incident angle of light and have the maximum value when light is incident at a predetermined angle. In addition, the phase difference pixel, for example, the photodiode 313-3 which includes the branched type waveguide 312 effectively receives light which is incident from the right side and acquires a maximum value but does not receive light which is incident from the left side and the output value thereof is a small value. Similarly, the photodiode 313-4 also effectively receives light which is incident from the left side and acquires a maximum value but does not receive light which is incident from the right side and the output value thereof is a small value.

As above, unlike the imaging pixel, the phase difference pixels are configured such that light from a predetermined direction is received but it is difficult for light to be received from directions other than the predetermined direction.

In addition, the maximum value of the imaging pixel (the photodiode 313-1) is greater than the maximum value of the phase difference pixels (the photodiode 214-2 and the photodiode 214-3) which do not include the branched type waveguide 312. The reason for this is that, in the case of the phase difference pixels which do not include the branched type waveguide 312, the quantity of incident light is reduced due to the influence of the light shield films 216, and thus the sensitivity is lower than that of the imaging pixel.

In contrast, the maximum value of the imaging pixel (the photodiode 313-1) is lower than the maximum value of the phase difference pixels (the photodiode 313-2 and the photodiode 313-3) which include the branched type waveguide 312. The reason for this is that, in the case of the phase difference pixels which include the branched type waveguide 312, the quantity of incident light increases at predetermined angles at which the maximum values are acquired due to the influence of the branched type waveguide 312, and thus the sensitivity is higher than that of the imaging pixel.

Subsequently, the graphs of the phase difference pixels which are shown by the thick solid lines and which include the branched type waveguide 312 will be compared with the graph of the phase difference pixel which is shown by the narrow solid line and does not include the branched type waveguide 312. The output value of the photodiode 313-3 which includes the branched type waveguide 312 and the output value of the photodiode 214-3 which does not include the branched type waveguide 312 commonly have the maximum value at a predetermined angle. However, the maximum value of the output value of the photodiode 313-3 which includes the branched type waveguide 312 is greater than the maximum value of the output value of the photodiode 214-3 which does not include the branched type waveguide 312, and thus it can be read that the sensitivity is improved.

As shown in FIGS. 6 to 8, when a configuration is made such that the branched type waveguide 312-1 and the branched type waveguide 312-2 are disposed over the phase difference pixels (the photodiode 313-2 and the photodiode 313-3) and the microlens 311 is commonly provided for the two phase difference pixels, it is possible to perform focus detection using the phase difference method in which the sensitivity is high.

That is, if an incident angle is deflected and light is irradiated to the imaging element which has such a structure, it is possible to cause light to be waveguided and received by the right and left photodiodes according to the incident angle. When such a structure is used, it is possible to distribute and output a signal, which is difficult to be received due to the light shading so far, to adjacent pixels, and thus a significant improvement in sensitivity can be expected.

In addition, since the incident angle of received light is determined based on whether or not being waveguided depending on the structure of the branched type waveguide 312, the incident angle of received light is the excellent characteristic of separation, and thus it is possible to significantly improve the characteristics of the phase difference pixels, as shown in FIG. 9.

In addition, in a detection unit (for example, the DSP circuit 23 in FIG. 1) which detects focusing a signal from the photodiode 313, the characteristics of which are significantly improved as above, it is possible to perform accurate focus detection or high-speed focus detection.

Setting of Each of Units of Focus Detection Apparatus According to First Embodiment Subsequently, setting of each of the units of the focus detection apparatus which is described with reference to FIGS. 6 to 9 will be described. As will be described below, it is possible to adjust sensitivity and separation capacity by adjusting, for example, the width of the light shield film 216 which is included in the focus detection apparatus. Although setting of each of the units of the focus detection apparatus will be described with reference to graphs shown in FIGS. 11 to 15, each of the units which can be adjusted will be described with reference to FIG. 10 as a prerequisite.

Figure 10:
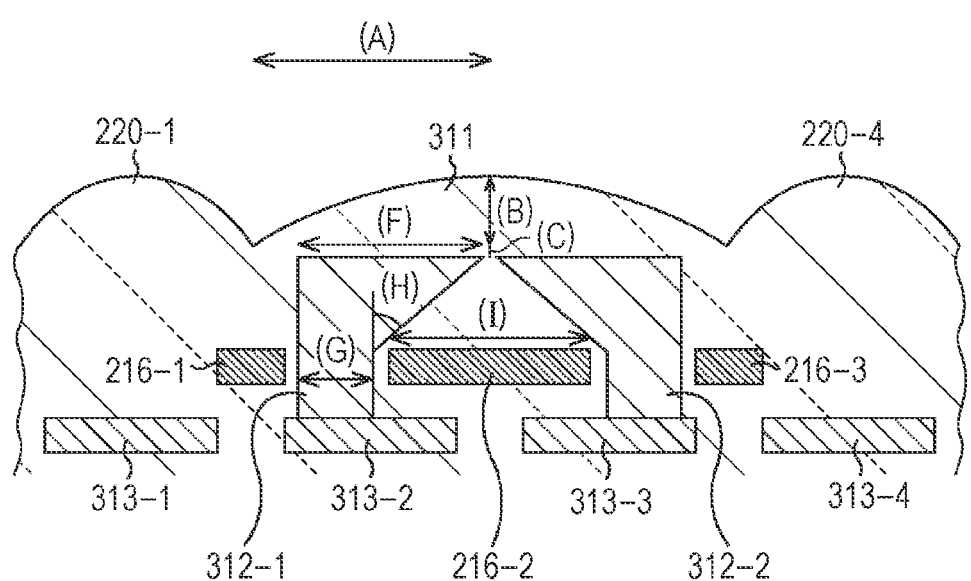
FIG. 10 is a diagram illustrating various settings of the phase difference pixels.

The focus detection apparatus shown in FIG. 10 is the focus detection apparatus shown in FIGS. 6 and 8, and is an apparatus which includes image plane phase difference detection pixels of a backside irradiation-type image sensor. (A) indicates a cell size and (B) indicates the thickness of the microlens 311. Here, a case in which a general cell size of 1.12 um is set is described as an example.

(C) indicates a distance between the microlens 311, and the branched type waveguide 312. (D) indicates the clad refractive index of the branched type waveguide 312, and (E) indicates the core refractive index of the branched type waveguide 312. (F) indicates the size (diameter) of the opening (on the side of microlens 311) of the branched type waveguide 312, and (G) indicates the size (diameter) of the cylinder on the lower side of the branched type waveguide 312.

(H) indicates the angle of the side wall of the branched type waveguide 312. (I) indicates the width of the light shield film 216-2. (J) indicates whether or not the antireflection film is present on the sensor. In the description below, the focus detection apparatus which includes the antireflection film will be described.

Although detailed numerical values are not described, each of the graphs in FIGS. 11 to 15 is a graph which is acquired by changing one or two settings of each of the above-described units, and remaining settings other than the changed settings are results in performing measurement in the same conditions.

Figure 11:
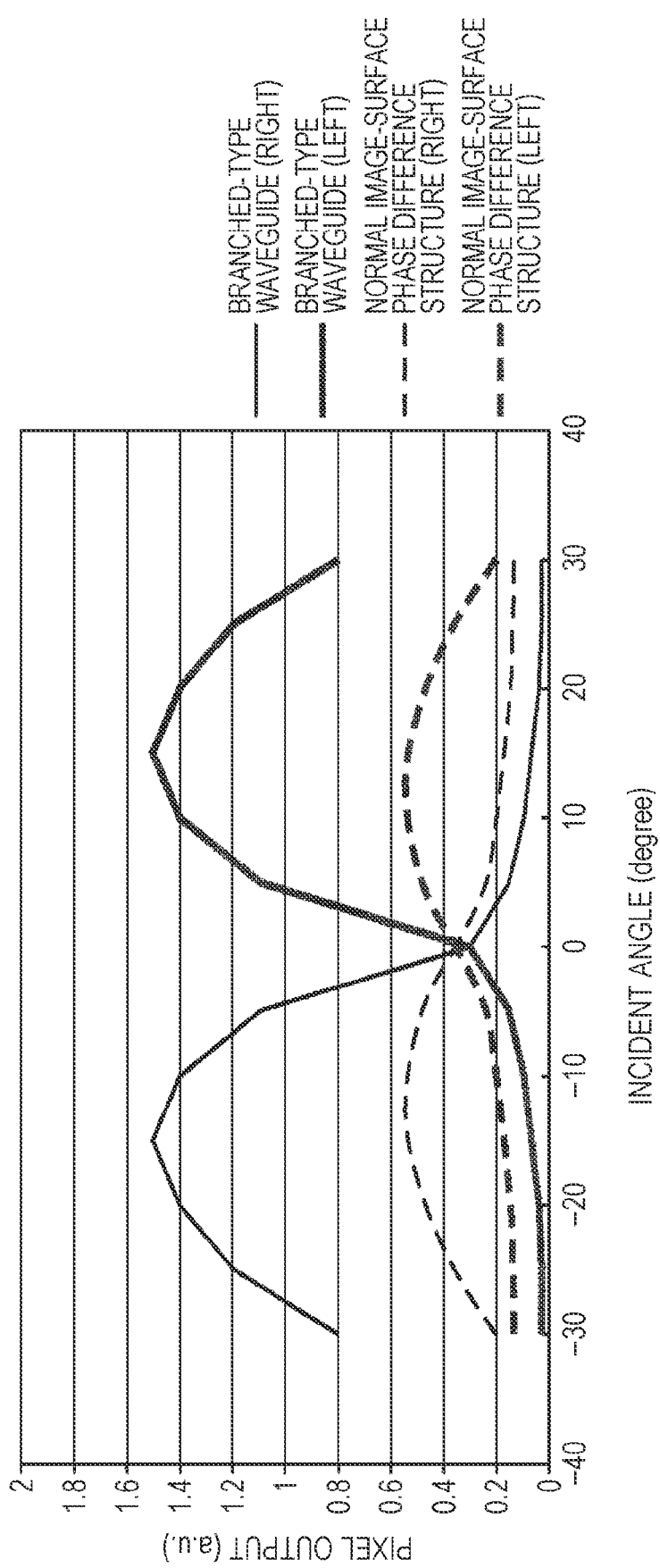
FIG. 11 is a graph illustrating the properties of phase difference pixels which include the branched type waveguides.

FIG. 11 is a graph which is obtained when each of the units of (A) to (J) is set to a reference value, and is a graph which is acquired by comparing an output from the photodiode 313 which includes the branched type waveguide 312 with an output from the photodiode 214 which does not include the branched type waveguide 312 based on the graph shown in FIG. 9. As described with reference to FIG. 9, when the branched type waveguide 312 is provided, sensitivity which is obtained when light is received from a predetermined angle is improved, and thus it is possible to acquire sufficient sensitivity. Further, the separation capacity is improved, and thus characteristics are significantly improved.

Meanwhile, when FIG. 10 is referred to again, the (B) thickness of the microlens 311 is set to a thickness which is the same as the thickness of the microlens 220 of the imaging pixel. However, the microlens 311 is shared by two pixels. In contrast, the microlens 220 is used by one pixel. Therefore, the lens power of the microlens 311 is lower than that of the microlens 220. However, as described above, the sensitivity and the separation capacity are improved, and thus it is possible to improve characteristics.

Figure 12:
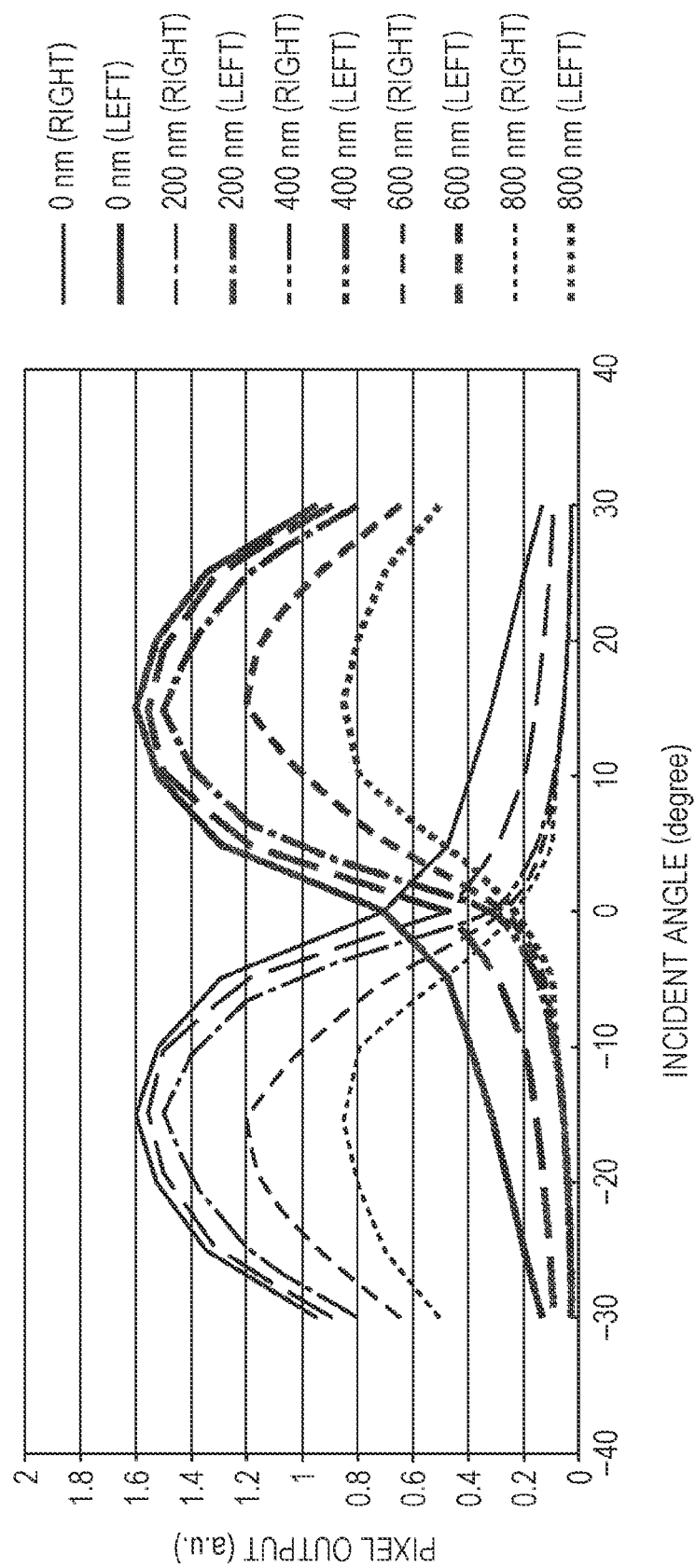
FIG. 12 is a graph illustrating the properties of the phase difference pixels which include the branched type waveguides.

FIG. 12 is a graph which is obtained when the respective outputs of the photodiode 313-2 and the photodiode 313-3 are measured in a case of changing the (I) width of the light shield film 216-2 which is provided between the branched type waveguide 312-1 and the branched type waveguide 312-2 (refer to FIG. 10). Settings other than the setting of the (I) width of the light shield film 216-2 are the same as settings used when the results in FIG. 11 are acquired.

First, it is read that the sensitivity is changed when the (I) width of the light shield film 216-2 differs from FIG. 12. In FIG. 12, a thin solid line is a graph which indicates an output from the photodiode 313-3 when the light shield film 216-2 is not present. When the graph of the thin solid line is viewed, a maximum value is acquired when the incident angle of light is in the range of (−20) to (−10), and the maximum value is a higher value, compared to a case in which the light shield film 216-2 is present. That is, it is read that, when the light shield film 216-2 is not present, the sensitivity is high.

When the graph of the thin solid line is viewed in the case in which the incident angle is 0 degrees, it is read that the value of the graph of the thin solid line is greater than the values of other graphs. The reason for this is related to the separation capacity, and it shows that the separation capacity drops compared to a case in which the light shield film 216-2 is present. Here, the index of the separation capacity is the slope of the variation amount of the sensitivity (the variation amount of the output value from the photodiode 313) when the incident angle is 0 degrees.

Figure 13:
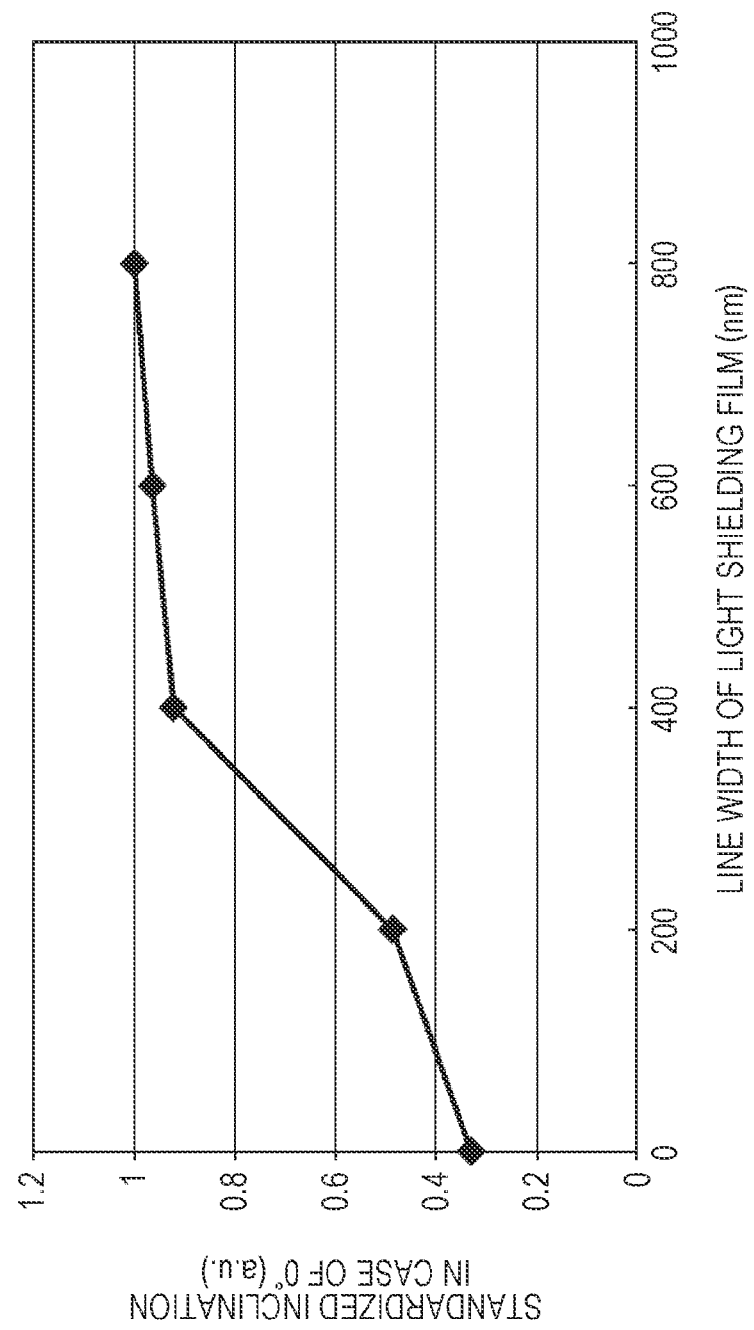
FIG. 13 is a graph illustrating the properties of the phase difference pixels which include the branched type waveguides.

FIG. 13 illustrates the slope of the variation amount of sensitivity when the incident angle is 0 degrees. In the graph shown in FIG. 13, a horizontal axis is the (I) width of the light shield film 216-2 and a vertical axis is the slope of the variation amount of sensitivity when the incident angle is 0 degrees. It can be understood that there is a tendency that the slope of the variation amount increases when the (I) width of the light shield film 216-2 increases based on the graph of FIG. 13. From this, it is read that the separation capacity is better when the (I) width of the light shield film 216-2 is wide.

Based on the graph of FIG. 12 and the graph of FIG. 13, it is read that the light shield film 216-2 which has a (I) width of 400 nm is a (I) width which is compatible with the separation capacity and the sensitivity. That is, for example, when the (I) width of the light shield film 216-2 is 0 nm, it is read that the sensitivity is high compared to other (I) widths based on the graph of FIG. 12. However, it is read that the separation capacity is low compared to other (I) widths based on the graph of FIG. 13. From this, it is understood that the light shield film 216-2 which has a (I) width of 400 nm is the (I) width which is compatible with the separation capacity and the sensitivity.

Here, when the (A) cell size is 1.12 um, the light shield film 216-2 which has a (I) width of 400 nm has a ratio to a cell size of approximately 40%. That is, from this result, it is understood that the line width of the light shield film 216-2 which has a ratio to a cell size of approximately 40% is an available value which is compatible with the separation capacity and the sensitivity.

As above, it is understood that, when the (I) width of the light shield film 216-2 is adjusted, it is possible to acquire graphs shown in FIGS. 12 and 13, and thus it is possible to adjust (set) the sensitivity and the separation capacity.

Meanwhile, here, description is made such that, when the (I) width of the light shield film 216-2 is set to 400 nm, the separation capacity and the sensitivity are the most excellent. However, such a detailed numerical value is an example, and the present disclosure is not limited thereto. The (I) width of the light shield film 216-2 which has the most excellent separation capacity and sensitivity is set based on the relationship between the set values of the respective units shown in FIG. 10, for example, the respective units, such as the (A) cell size and the (B) thickness of the microlens 311, and there is not necessarily a limitation that the (I) width of the light shield film 216-2 which has a ratio to a cell size of approximately 40% is most excellent.

However, since it is possible to adjust (set) the separation capacity and the sensitivity using the (I) width of the light shield film 216-2, it is possible to acquire desired separation capacity and sensitivity. This means that, for example, with regard to an individual request that the separation capacity not be high but the sensitivity be high, it is possible to acquire desired separation capacity and sensitivity by adjusting the (I) width of the light shield film 216-2. In addition, as will be described below, it is possible to further perform adjustment in order to acquire desired separation capacity and sensitivity using a material which forms the branched type waveguide 312, or the like.

Figure 14:
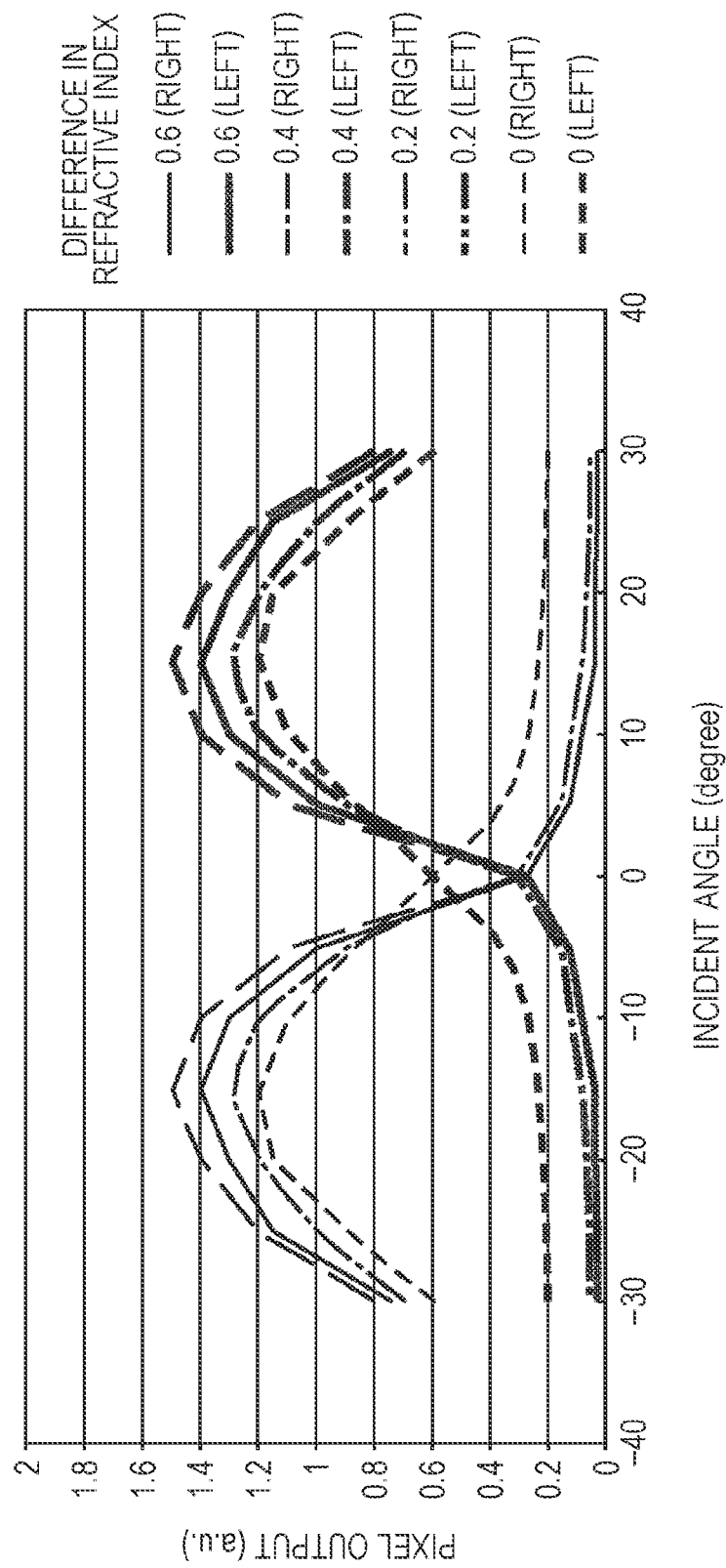
FIG. 14 is a graph illustrating the properties of the phase difference pixels which include the branched type waveguides.

Subsequently, differences in the sensitivity and the separation capacity due to differences in the material which forms the branched type waveguide 312 will be described. FIG. 14 is a graph illustrating the sensitivity acquired based on a difference in the materials of the branched type waveguide 312, and a graph obtained when the difference in the outputs of the photodiodes 313-2 and 313-3 is measured based on a difference in the (E) core refractive index of the branched type waveguide 312 and the (D) clad refractive index of the branched type waveguide 312.

It is assumed that the refractive index of a material which forms the branched type waveguide 312 is the (E) core refractive index and the refractive index of a material around the branched type waveguide 312 is the (D) clad refractive index. When the core of the branched type waveguide 312 is formed of SiN, the (E) core refractive index of the branched type waveguide 312 is approximately 1.9. In addition, when the clad of the branched type waveguide 312 is formed of $SiO_2$, the (D) clad refractive index of the branched type waveguide 312 is approximately 1.5.

The graph shown in FIG. 14 is a graph obtained when the clad of the branched type waveguide 312 is formed of SiN and a material in which the (E) core refractive index is in a range of 1.5 to 2.1 is used. If the (E) core refractive index is changed from 1.5 to 2.1 when the (D) clad refractive index is 1.5, the value of difference (difference in the refractive indexes) is changed from 0 to 0.6.

It is read that maximum value is changed and sensitivity is changed due to the difference in the refractive indexes based on the graph shown in FIG. 14. In addition, it is read that separation capacity is changed because a value obtained when the incident angle is 0 degree is changed. It is read that it is possible to improve separation capacity and sensitivity when the difference in the refractive indexes is equal to or greater than 0.2 based on the graph shown in FIG. 14. From this, it is understood that, when the difference in the refractive indexes is changed, it is possible to set desired sensitivity and separation capacity.

Here, a case in which the width of the light shield film 216-2 is changed and a case in which the difference in the refractive indexes is changed using the material of the branched type waveguide 312 are verified, and thus it is confirmed that it is possible to set sensitivity and separation capacity using the width of the light shield film 216-2 and the difference in the refractive indexes with reference to FIGS. 12 to 14. Here, although not shown in the drawing, when each of the units in FIG. 10, for example, the (B) thickness of the microlens 311, the distance between the lens and the (C) branched type waveguide 312, the (F) size of the opening of the branched type waveguide 312, the (G) size of the opening on the lower side of the branched type waveguide 312, the (H) angle of the side wall, and the like is changed, sensitivity and separation capacity change. When each of the units is set, it is possible to set a value which enables the desired sensitivity and separation capacity to be acquired.

As above, when the branched type waveguide 312 is provided, sensitivity is improved, and thus it is possible to realize autofocusing an image surface phase difference method in which the separation capacity is improved.

Configuration of Focus Detection Apparatus
According to Second Embodiment

Figure 15:
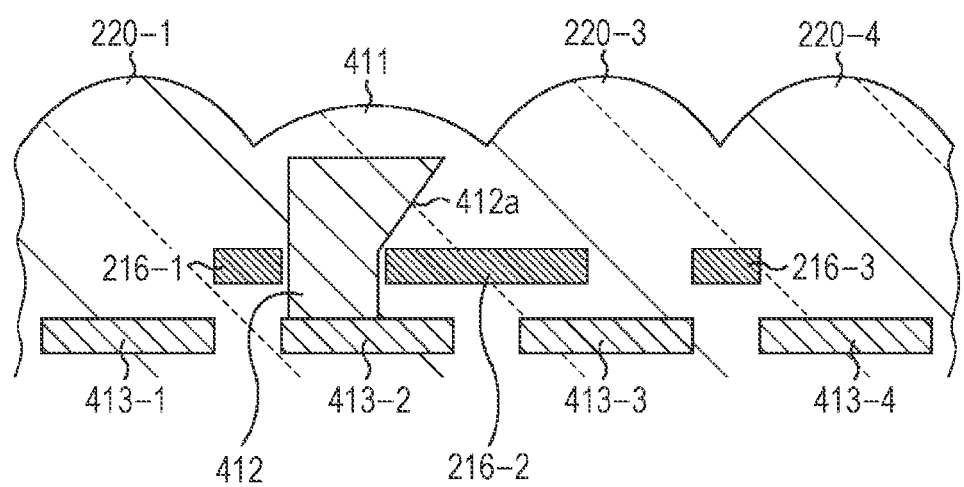
FIG. 15 is a diagram illustrating the configuration of a focus detection apparatus according to a second embodiment to which the present disclosure is applied.

Subsequently, a shape of a branched type waveguide 312 according to a second embodiment will be described. FIG. 15 is a diagram illustrating the configuration of the phase difference pixels of a focus detection apparatus according to a second embodiment. In the phase difference pixels shown in FIG. 15, the same reference numerals refer to the same components as those of the phase difference pixels shown in FIG. 4, and the description thereof will not be repeated. In the focus detection apparatus shown in FIG. 15, the photodiode 413-2 is set to the phase difference pixel. Although not shown in FIG. 15, the photodiodes 413, which are located in locations separated by a predetermined number of pixels, are set to the phase difference pixels.

In the focus detection apparatus shown in FIG. 15, it is possible to set two continuous pixels as a single group of phase difference pixels. Further, it is possible to set pixels, which are located in separated locations, to a single group of phase difference pixels while interposing a predetermined number of pixels therebetween.

When two continuous pixels are set to a single group of phase difference pixels, there is a possibility that image quality deteriorates in an imaged image, that is, image data corresponding to two pixels which are set to the phase difference pixels is lost, images of the corresponding parts become coarse, and the like. When pixels which are located in separated locations are set to the group of the phase difference pixels, it is possible to reduce the deterioration of the image quality, compared to a case in which two continuous pixels are set to the group of the phase difference pixels.

In the focus detection apparatus shown in FIG. 15, one microlens 411 is provided on the photodiode 413-2 which functions as the phase difference pixel. The microlens 411 is different from the microlens 311 according to the first embodiment, and is a lens corresponding to one pixel. That is, similarly to other microlenses 220, the microlens 411 is provided to have a one-to-one relationship with the photodiode.

Although being described with reference to FIG. 19, when the lens power of the microlens 411 differs, the separation capacity differs. Therefore, in order to acquire optimal separation capacity, it is necessary to use the microlens 411, the lens power of which is optimal. The lens power depends on the (B) thickness of the microlens 411. From this, there is a case in which the thickness of the microlens 411 is set to a thickness which is different from that of the microlens 220 of the imaging pixel. In an example shown in FIG. 15, the microlens 411 is configured to be thinner than the microlens 220.

The phase difference pixel is provided with a reflection type waveguide. The photodiode 413-2 is provided with a reflection type waveguide 412. The reflection type waveguide 412 is the same as the branched type waveguide 312, which is described according to the first embodiment, in that the reflection type waveguide 412 includes a structure in which light converges according to an incident angle and is guided to the photodiode 413-2, but the reflection type waveguide 412 is different from the branched type waveguide 312 in that a part of the reflection type waveguide 412 is provided with a reflective plate.

It is possible to cause the shape of the reflection type waveguide 412 to be the same as the shape of the branched type waveguide 312, for example, the shape shown in FIGS. 7A and 7B. In addition, in order to control reflection, the reflection type waveguide 412 may have a shape combined with a fine slope.

In the reflection type waveguide 412 shown in FIG. 15, a part of an internal side surface, that is, a side wall on the right side in the drawing is a reflective plate 412a. Meanwhile, here, although description will be continued such that a part of the reflection type waveguide 412 is the reflective plate 412a, all of the internal side walls of the reflection type waveguide 412 may be configured as the reflective plate. In addition, although all of the side walls of the reflection type waveguide 412 may be configured as the reflective plate, a configuration in which a part thereof functions as the reflective plate may be used.

Figure 16:
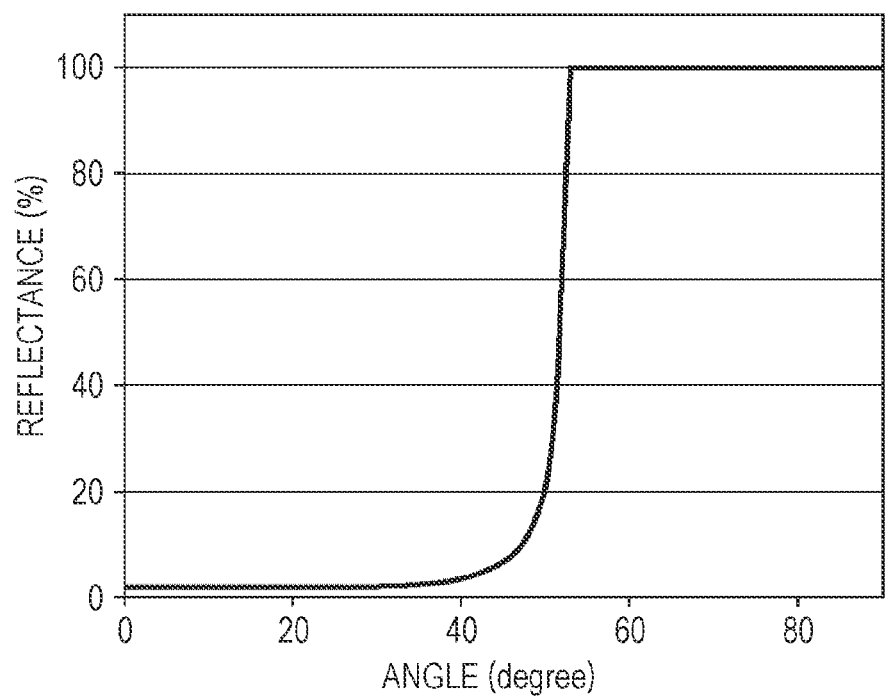
FIG. 16 is a graph illustrating reflectance when different materials are used.

Here, an example, in which the reflective plate 412a is configured such that the materials of the inside and the outside (core and clad) of the reflection type waveguide 412 are different from each other and difference in refractive indexes generated due to the different materials is used, will be shown. FIG. 16 is a graph related to reflectance obtained when a predetermined material is used.

A graph shown in FIG. 16 is a graph in which a horizontal axis indicates the incident angle of light and a vertical axis indicates reflection angle. When SiN is used as the core of the reflection type waveguide 412, the refractive index thereof is 1.9. When SiO is used as the external material of the reflection type waveguide 412, the refractive index thereof is 1.5. The graph shown in FIG. 16 illustrates reflection characteristics when the two different materials are used. The other settings are the same as in the case of the above-described branched type waveguide 312 and, for example, the (H) angle of the reflective plate 412a is set to 40 degrees.

When FIG. 16 is referred to, it is read that reflectance sharply increases while the incident angle of light being at 50 degrees is used as a boundary. That is, when the incident angle of light is equal to or greater than 50 degrees and when the incident angle of light is equal to or less than 50 degrees, reflectance greatly differs. It is read that, when such a characteristic is used, it is possible to prepare the reflection type waveguide 412 which can effectively receive light, which is equal to or higher than a critical angle, and select the angle of received light.

Figure 17:
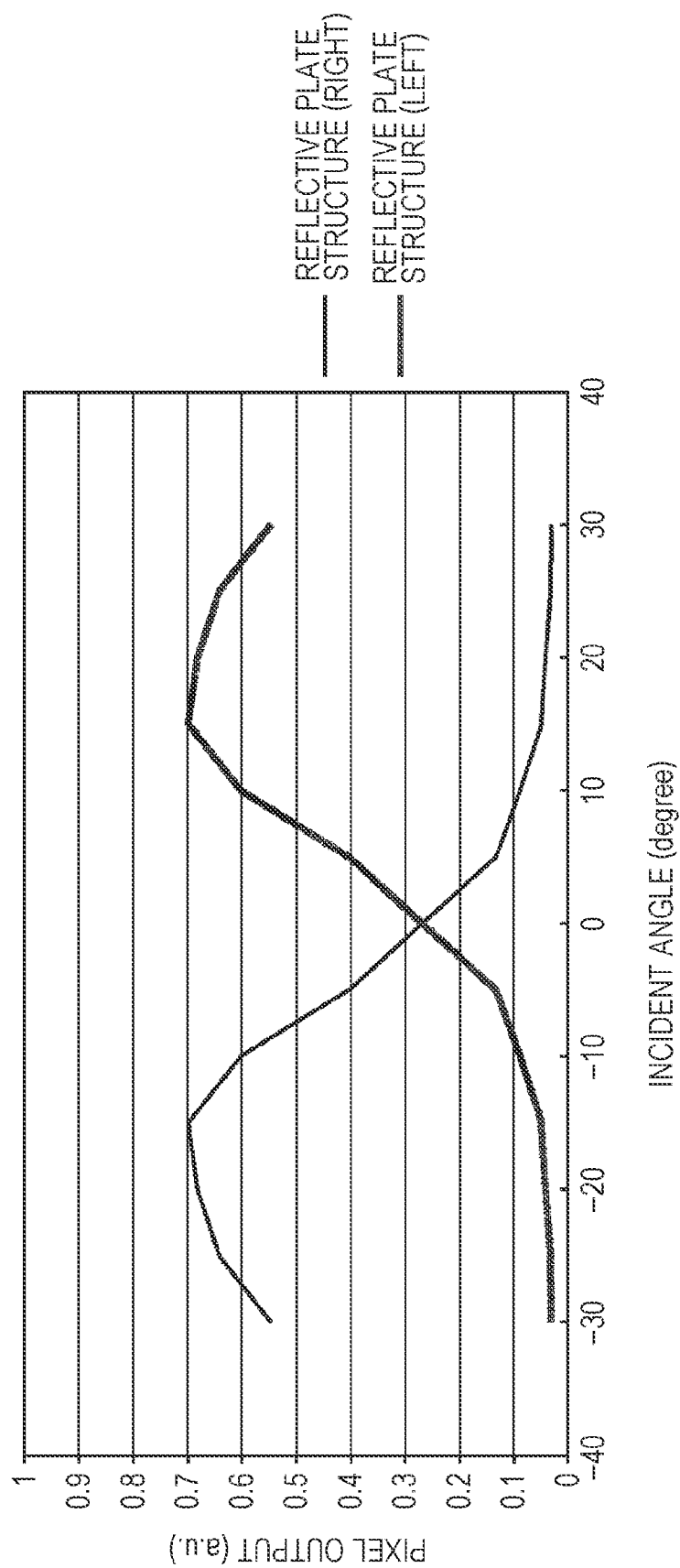
FIG. 17 is a graph illustrating the properties of phase difference pixels which include reflection type waveguides.

FIG. 17 illustrates a graph related to the output of the pixel which includes the reflection type waveguide 412 having the reflective plate 412a using the above characteristics. FIG. 17 is a graph illustrating the relationship between an output from the photodiode 413, which includes the reflection type waveguide 412, and the incident angle of light. In the graph shown in FIG. 17, a horizontal axis indicates the incident angle of light and a vertical axis indicates an output value from the pixel (photodiode 413).

Based on the graph shown in FIG. 17, it is read that a structure is made in which a high output value is acquired with regard to light which is incident from a predetermined angle and it is possible to selectively receive light which is incident from the predetermined angle. Therefore, it is read that separation capacity is improved.

In addition, when compared to the graph (graphs of thin dotted line or the thick dotted line) in the case of the normal image plane phase difference structure (structure in which the branched type waveguide 312 or the reflection type waveguide 412 is not included) shown in FIG. 11, the maximum value is equal to or less than 0.6 in the case of the normal image plane phase difference structure and the maximum value is equal to or greater than 0.6 in the case of the structure in which the reflection type waveguide 412 is included. From this, it is read that, in the case of the structure in which the reflection type waveguide 412 is included, sensitivity is improved.

As above, in the phase difference pixel which includes the reflection type waveguide 412, both sensitivity and separation capacity are improved, and thus it is possible to improve the accuracy of focus detection.

Setting of Each Unit of Focus Detection Apparatus According To Second Embodiment Subsequently, setting of each of the units of the focus detection apparatus, which is described with reference to FIGS. 15 to 17, will be described. As will be described below, it is possible to adjust separation capacity and sensitivity by adjusting the refractive index of, for example, the material which forms the focus detection apparatus. The setting of each of the units of the focus detection apparatus will be described with reference to graphs shown in FIGS. 18 and 19.

Here, as a prerequisite, a case, in which the focus detection apparatus which is set as described with reference to FIG. 10 is used, will be described as an example. That is, FIGS. 18 and 19 are graphs which may be acquired when each of the units (A) to (J) of the focus detection apparatus shown in FIG. 10 is set to a value which is a reference described with reference to FIG. 10.

Figure 18:
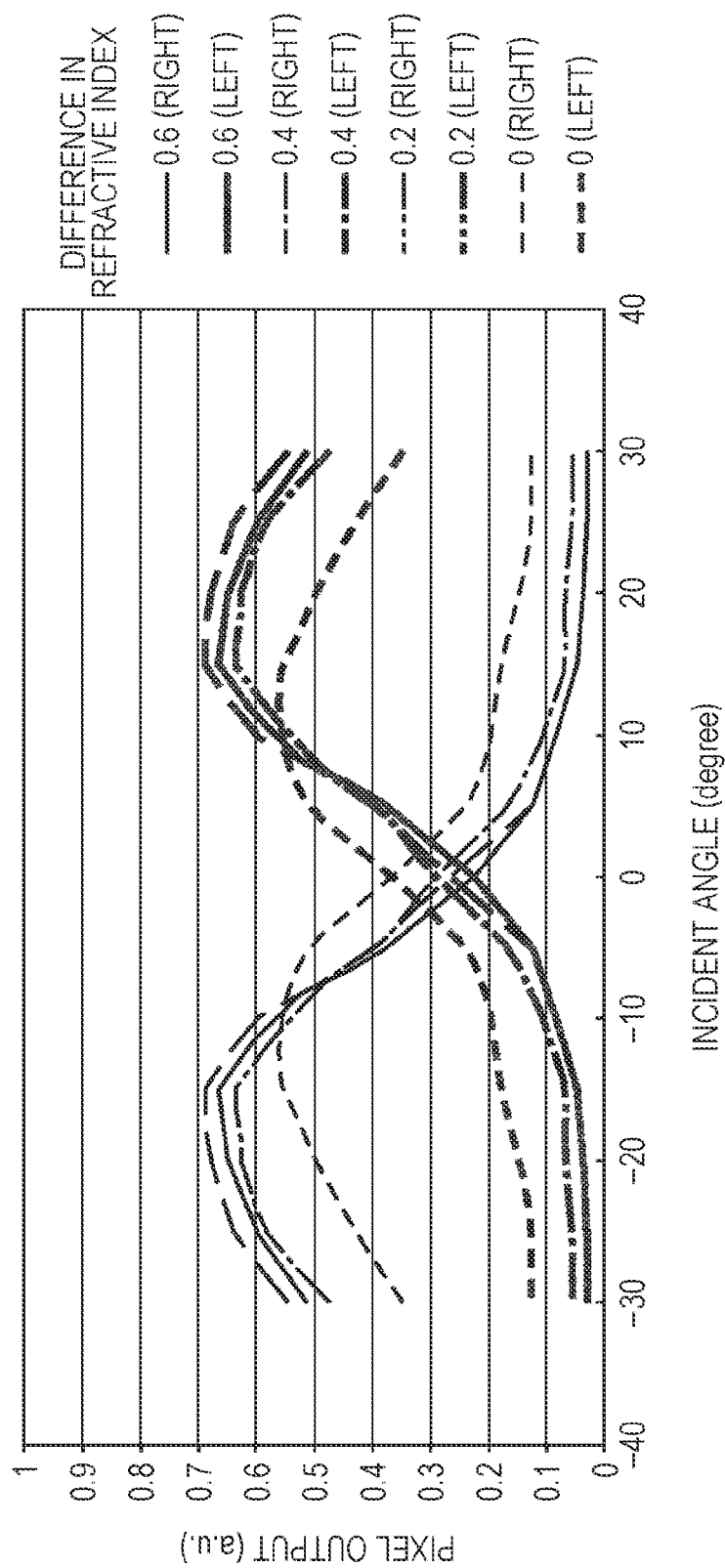
FIG. 18 is a graph illustrating the properties of the phase difference pixels which include the reflection type waveguides.

A graph shown in FIG. 18 is a graph which is related to an output from the phase difference pixel based on the difference in the materials of the reflection type waveguide 412. That is, in this case, the graph shown in FIG. 18 is a graph obtained when the difference in outputs of the photodiode 413-2 (photodiode 413 which is not shown in the drawing and which constructs a pair with the photodiode 413-2) is measured based on the difference between the (D) clad refractive index of the reflection type waveguide 412 and the (E) core refractive index of the reflection type waveguide 412.

Although the above described FIG. 14 is the graph acquired in a structure in which the branched type waveguide 312 is included, FIG. 14 is a graph acquired in a configuration in which the reflection type waveguide 412 is included with the same setting as that of the focus detection apparatus in a case in which the graph of FIG. 14 is acquired.

It is assumed that the refractive index of the material which forms the reflection type waveguide 412 is the (E) core refractive index, and the refractive index of the material around the reflection type waveguide 412 is the (D) clad refractive index.

The graph shown in FIG. 18 is a graph acquired when the clad of the reflection type waveguide 412 is formed of SiN and the (E) core refractive index is changed from 1.5 to 2.1. When the (D) clad refractive index is 1.5 and a material which has the (E) core refractive index in a range of 1.5 to 2.1 is used, the value of difference therein (difference in the refractive indexes) is changed from 0 to 0.6.

It is read that maximum value is changed and sensitivity is changed due to the difference in the refractive indexes based on the graph shown in FIG. 18. In addition, it is read that, since a value when the incident angle is 0 degree (the variation amount of the output value) is changed, the separation capacity is changed. It is read that it is possible to improve separation capacity and sensitivity when the difference in the refractive indexes is equal to or greater than 0.2 based on the graph shown in FIG. 18.

From this, in the case of the example, it is understood that, when the difference in the refractive indexes is equal to or greater than 0.2, an effect is increased and the necessary refractive index of the reflective plate 412a is limited. In addition, it is understood that, when the difference in the refractive indexes is changed, it is possible to set desired sensitivity and separation capacity.

Subsequently, change in an output value from the photodiode 413-2 due to the (B) thickness of the microlens 411 will be described with reference to FIG. 19. In a graph of FIG. 19, a horizontal axis indicates the incident angle of light and a vertical axis indicates an output from the photodiode 413-2 (photodiode 413 which is not shown in the drawing and which constructs a pair with the photodiode 413-2).

The lens power of the microlens 411 differs due to the (B) thickness of the microlens 411. If the lens power of the microlens 411 increases, a range of angle of light which reaches the reflective plate 412a increases, and thus it is conceivable that separation capacity and the like is affected. As shown in FIG. 19, it is read that, if the (B) thickness of the microlens 411 (the lens power of the microlens 411) is changed, sensitivity and separation capacity change.

It is read that, the output value of the photodiode 413 becomes the maximum when the (B) thickness of the microlens 411 is 0.3 μm from among 0.1 μm, 0.3 μm, and 0.5 μm, and 0.3 μm is the (B) thickness which causes the most excellent sensitivity to be acquired. In addition, it is read that the separation capacity is the highest when the (B) thickness of the microlens 411 is 0.3 μm based on a slope obtained when the incident angle is 0 degrees.

Here, a case in which the (B) thickness of the microlens 220 of the imaging pixel is 0.5 μm is described as an example. If the (B) thickness of the microlens 220 of the imaging pixel is the same as the (B) thickness of the microlens 411 of the phase difference pixel, it is understood that the sensitivity and the separation capacity of the phase difference pixel (in this case, the photodiode 413-2) are not in the most excellent state.

In other words, when the (B) thickness of the microlens 411 of the phase difference pixel is thinner than the (B) thickness of the microlens 220 of the imaging pixel, the sensitivity and the separation capacity of the phase difference pixel (in this case, the photodiode 413-2) are in the most excellent state. Further, in other words, when the power of the microlens 411 of the phase difference pixel drops compared to the power of the microlens 220 of the imaging pixel, it is possible to improve the sensitivity and the separation capacity.

From this, as shown in FIG. 15, the thickness of the microlens 220 is configured to be different from the thickness of the microlens 411, and thus a structure in which the microlens 411 is configured to be thinner than the microlens 220 is acquired.

As above, the phase difference pixel includes the reflection type waveguide 412, with the result that it is possible to improve the sensitivity and the separation capacity, and thus the accuracy of focus detection is improved, thereby enabling higher-speed focus detection.

Figure 19:
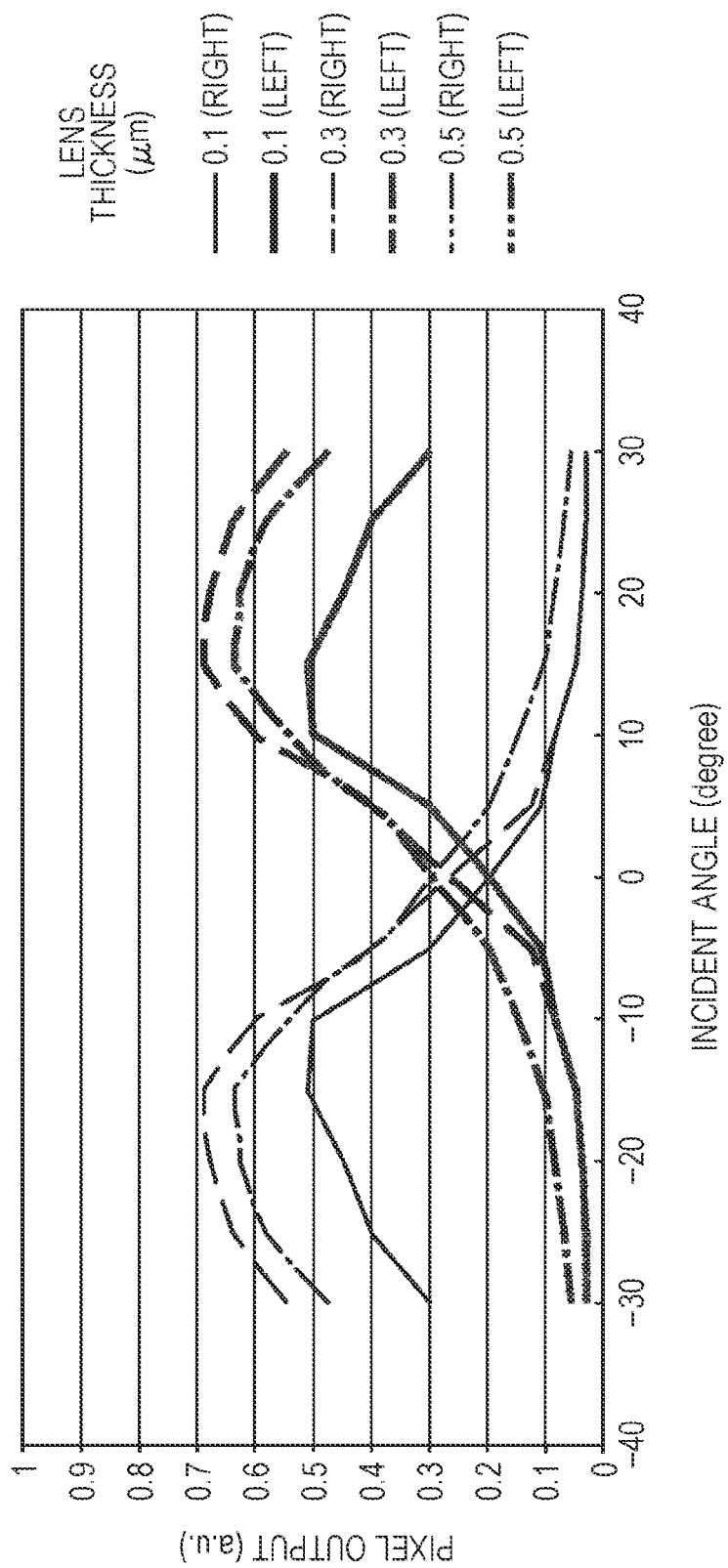
FIG. 19 is a graph illustrating the properties of the phase difference pixels which include the reflection type waveguides.

Meanwhile, here, with reference to FIGS. 18 and 19, a case in which the difference in the refractive indexes is changed due to the material of the reflection type waveguide 412 and a case in which the thickness of the microlens 411 is changed are verified, and it is confirmed that it is possible to set the sensitivity and the separation capacity based on the difference in the refractive indexes of the reflection type waveguide 412 and the thickness of the microlens 411. Here, although not shown in the drawing, even when each of the units of FIG. 10, for example, the (C) distance between the lens and the reflection type waveguide 412, the (F) size of the opening of the reflection type waveguide 412, the (G) size of the opening on the lower side of the reflection type waveguide 412, the (H) angle of the side wall, and the like is changed, the sensitivity and the separation capacity are changed, and thus it is possible to set a value, which enables desired sensitivity and separation capacity to be acquired, by setting each of the units.

Meanwhile, in the above-described embodiment, an example, in which the reflective plate 412a is realized using the difference in the refractive indexes of materials which form the respective inside and outside of the reflection type waveguide 412, is described. However, the reflective plate 412a may be constructed using another method. For example, a configuration may be made in which a material, such as aluminum, which has high reflective performance is used for the reflective plate 412a, and is provided for the side wall of the reflection type waveguide 412.

Manufacture

Figure 20:
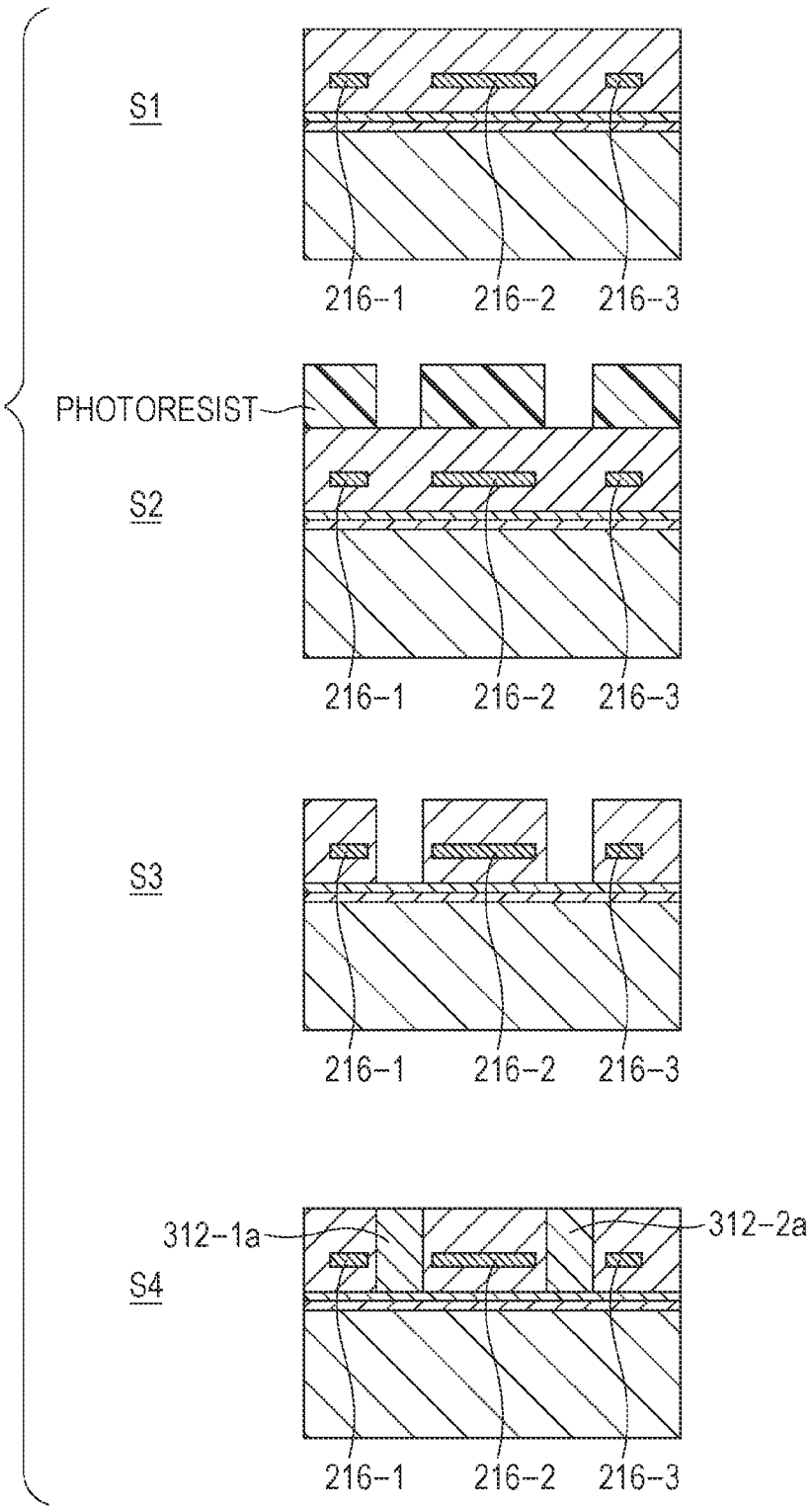
FIG. 20 is a diagram illustrating a manufacturing process.
Figure 21:
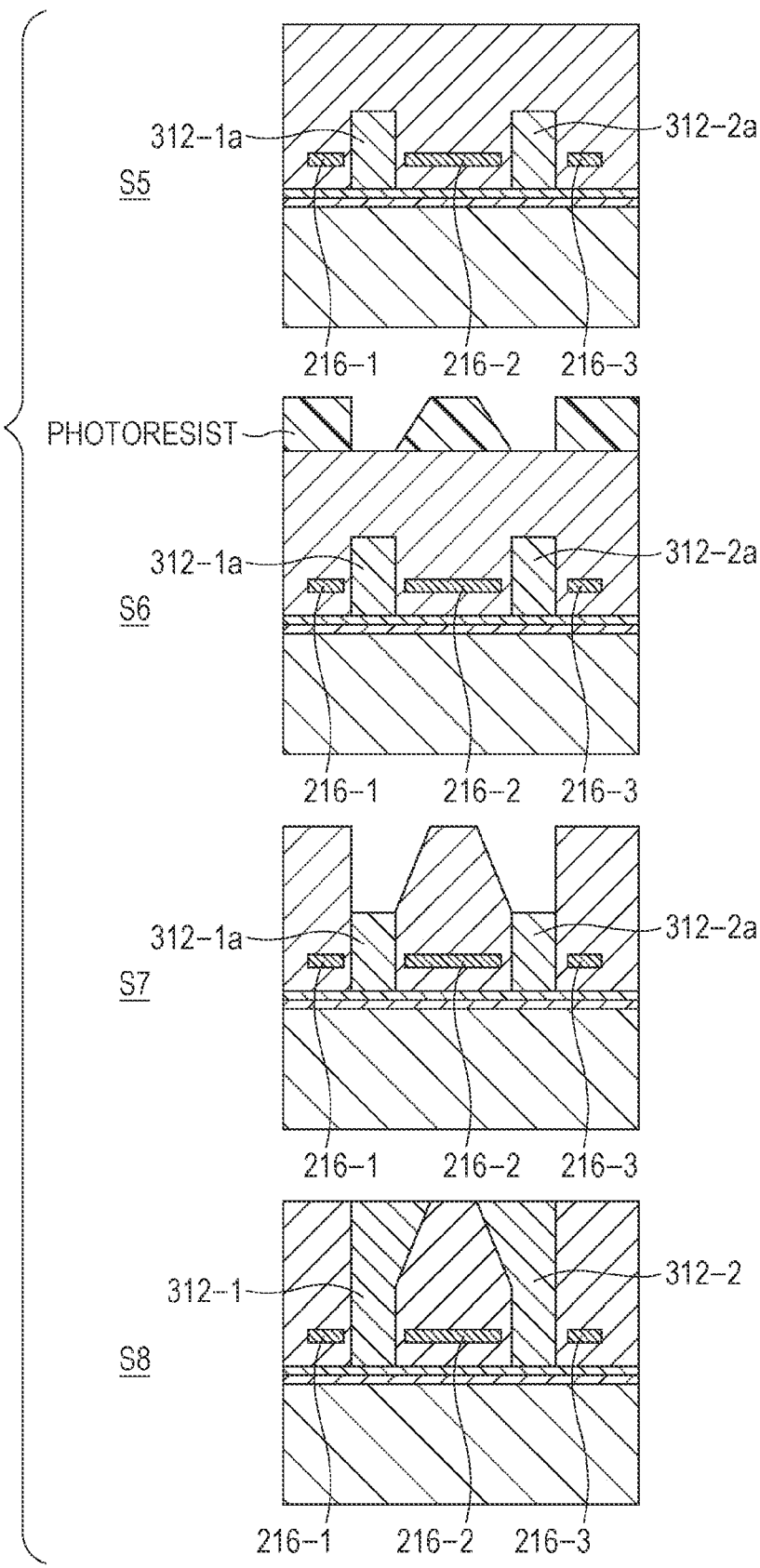
FIG. 21 is a diagram illustrating the manufacturing process.

Subsequently, the description of the manufacture of the focus detection apparatus which includes the branched type waveguide 312 or the reflection type waveguide 412 will be added. FIGS. 20 and 21 are diagrams illustrating a manufacturing process of the focus detection apparatus. Here, a case in which the branched type waveguide 312 is formed is described as an example. However, a basic manufacturing process is the same as in a case in which the reflection type waveguide 412 is formed. In the description below, when the branched type waveguide 312 is changed to the reflection type waveguide 412, it is possible to apply the basic manufacturing process to a manufacturing process of forming the reflection type waveguide 412.

In step S1 (FIG. 20), a substrate on which the branched type waveguide 312 is formed is prepared. Here, since the formation of the branched type waveguide 312 is described, the description or illustration of the formation of other parts is appropriately simplified. The substrate which is prepared in step S1 is a substrate on which the light shield film 216, the photodiode 313, and the like are formed.

A first lithography process is performed on the substrate in step S2. In step S2, a resist pattern is formed using photolithography. As shown in FIG. 20, the resist pattern is a pattern in which a resist is coated on parts other than a part where the branched type waveguide 312 is formed. In addition, when the shape of the branched type waveguide 312 on the side of the photodiode 313 is a cylinder shape as shown in FIGS. 7A and 7B, such a cylinder shape is a pattern to be prepared (a pattern in which a part where the resist is not provided is the cylinder shape).

In step S3, a first dry etching process is performed, and cylinder shaped cavities, filled with a material which forms the lower side part of the branched type waveguide 312 (hereinafter, referred to as a branched type waveguide 312-1a and a branched type waveguide 312-2a), are provided on the substrate.

In step S4, core materials which form the branched type waveguide 312-1a and the branched type waveguide 312-2a are implanted in the cavities which are provided on the substrate. According to the above-described example, SiN is used as the core materials. The cavities provided on the substrate, in which SiO is used as the clad material, are filled with the core materials, and thus the branched type waveguide 312-1a and the branched type waveguide 312-2a are formed.

In step S5 (FIG. 21), after the branched type waveguide 312-1a and the branched type waveguide 312-2a are formed, the clad materials (in this case, SiO) are accumulated, and thus a film is manufactured. The thickness of the film to be manufactured is approximately the same as the height of the upper side part of the branched type waveguide 312 (hereinafter, described as the branched type waveguide 312-1b and the branched type waveguide 312-2b).

In step S6, a second lithography process is performed. Similarly to step S2 in which the first lithography process is performed, a resist pattern is formed using the photolithography in step S6. As shown in FIG. 21, the resist pattern is a pattern in which a resist is coated on parts other than the part where the branched type waveguide 312 is formed.

As shown in step S6 of FIG. 21, the resist corresponding to the parts where the branched type waveguide 312-1b and the branched type waveguide 312-2b are formed includes a resist pattern which is formed in such a way that only one-sided side walls are inclined the same as the shapes of the branched type waveguide 312-1b and the branched type waveguide 312-2b.

In step S7, a second dry etching process is performed. Similarly to step S3 in which the first dry etching process is performed, step S7 is a process of providing the cavities filled with the materials which form the upper side part of the branched type waveguide 312 (the branched type waveguide 312-1b and the branched type waveguide 312-2b) to the substrate.

In step S8, the implantation of a second core material is performed. Similar to step S4 which is the process of implanting the first core material, the core material is implanted in the cavities which are provided on the substrate. When SiO is used as the material which forms the branched type waveguide 312-1a, SiO is also used as the core material in step S8, and the cavities which are provided on the substrate are filled with the material.

In this way, the branched type waveguide 312 is formed at two separate times. In the same manner, it is possible to form the reflection type waveguide 412 at two separate times. Meanwhile, when a material, which is different from the materials that form the core and the clad of the reflection type waveguide 412, for example, a material such as aluminum, is used for a part which functions as the reflective plate 412a of the reflection type waveguide 412, it is possible to prepare the branched type waveguide by adding a process to coat the material, such as aluminum, on the side wall of the substrate before step S7 is performed.

Meanwhile, when the branched type waveguide 312 (reflection type waveguide 412) is formed as shown in FIG. 7B, it is possible to form the branched type waveguide at one time instead of two separate times as described above.

For example, it is possible to form the branched type waveguide by performing steps S1 to S4. When the resist is coated in step S2, it is possible to form the branched type waveguide 312 (reflection type waveguide 412) as shown in FIG. 7B by forming the resist pattern in which only the one sided-side wall is inclined as shown in the resist pattern of step S6 (FIG. 21).

It is possible to change the manufacturing process of the branched type waveguide using the shape of the branched type waveguide 312 (reflection type waveguide 412) but the present disclosure is not limited to the above-described steps.

In the above-described embodiments, the image plane phase difference structure, in which light is divided into two types, that is, light which is incident from the left and light which is incident from the right, has been described. However, the present disclosure is not limited to be applied to only the case in which the light is divided into two types of light. That is, it is possible to apply the present disclosure to a case in which light is divided into multi-direction light.

As described above, according to the embodiment of the present disclosure, it is possible to provide the phase difference pixels, the sensitivity and the separation capacity of which are improved, and it is possible to improve the accuracy of focus detection using the phase difference method. In addition, it is possible to cause a time that is taken for the focus detection to be short because the sensitivity and the separation capacity are improved. In addition, it is possible to apply the present disclosure even in a case in which pixel sizes are reduced, and thus it is possible to improve the sensitivity and the separation capacity even in the size-reduced pixels, thereby enabling the high-speed focus detection to be realized.

Meanwhile, the present disclosure is not limited to the above-described embodiments, and various modifications are possible without departing from the gist of the present disclosure.

Meanwhile, the present disclosure can include the following configurations.

(1) A focus detection apparatus including: microlenses; light reception units that receive light which is incident through the microlenses; waveguides that cause light, which is incident to the microlenses at a predetermined angle, to be received by the light reception units and that are provided between the microlenses and the light reception units; and a detection unit that detects focusing output values from the light reception units.

(2) In the focus detection apparatus of (1), the waveguides have an asymmetrical shape, a part of which includes a slope of a side wall according to light reception angle.

(3) In the focus detection apparatus of (1) or (2), the waveguides are respectively provided to the continuous light reception units, and a light shield film is provided at a central part between the waveguides.

(4) In the focus detection apparatus of (3), the microlenses are arranged at locations that are disposed over the continuous light reception units.

(5) In the focus detection apparatus of any one of (1) to (4), an inside and an outside of the waveguide are formed of different materials, and a difference between a refractive index of the material of the inside and a refractive index of the material of the outside is equal to or greater than 0.2.

(6) In the focus detection apparatus of (1), the waveguides are configured to include reflective plates that reflect light which is incident at a predetermined angle or greater.

(7) In the focus detection apparatus of (6), the microlenses that are arranged on the waveguides are configured to have lower lens power than the microlenses which are not arranged on the waveguides.

(8) In the focus detection apparatus of (6) or (7), a difference in the refractive indexes of the materials which form the reflective plates is equal to or greater than 0.2.

(9) An electronic apparatus including: microlenses; light reception units that receive light which is incident through the microlenses; waveguides that cause light, which is incident to the microlenses at a predetermined angle, to be received by the light reception units and that are provided between the microlenses and the light reception units; a detection unit that detects focusing signals from the light reception units which are provided with the waveguides; and a signal processing unit that performs a signal process on signals output from the light reception units which are not provided with the waveguides.

(10) A manufacturing apparatus which manufactures a focus detection apparatus including: microlenses; light reception units that receive light which is incident through the microlenses; waveguides that cause light, which is incident to the microlenses at a predetermined angle, to be received by the light reception units and that are provided between the microlenses and the light reception units; and a detection unit that detects focusing output values from the light reception units.

(11) In the manufacturing apparatus of (10), the waveguides are manufactured by repeating a lithography process, a dry etching process, and a process of implanting materials which form the waveguides a plurality of times.

(12) A method of manufacturing a focus detection apparatus, the apparatus including: microlenses; light reception units that receive light which is incident through the microlenses; waveguides that cause light, which is incident to the microlenses at a predetermined angle, to be received by the light reception units and that are provided between the microlenses and the light reception units; and a detection unit that detects focusing output values from the light reception units.

(13) In the method of (12), the waveguides are manufactured by repeating a lithography process, a dry etching process, and a process of implanting materials which form the waveguides a plurality of times.

It should be understood by those skilled in the art that various modifications, combinations, sub-combinations and alterations may occur depending on design requirements and other factors insofar as they are within the scope of the appended claims or the equivalents thereof.

What is claimed is:

1. A focus detection apparatus comprising:
   microlenses;
   photodiodes that receive light which is incident on the microlenses;
   asymmetrically shaped waveguides that cause light, which is incident on the microlenses at a predetermined incident angle, to be received by the photodiodes, wherein the waveguides are between the microlenses and the photodiodes; and
   a detector that detects focusing using output values from the photodiodes.

2. The focus detection apparatus according to claim 1,
   wherein a portion of each waveguide includes a sloped side wall, wherein the slope of the side wall is based on a light reception angle.

3. The focus detection apparatus according to claim 1,
   wherein for at least two continuous photodiodes, a waveguide is provided for each photodiode of the at least two continuous photodiodes, and a light shield film is provided between the waveguides.

4. The focus detection apparatus according to claim 3,
   wherein the microlenses are arranged at locations that are disposed over the continuous photodiodes.

5. The focus detection apparatus according to claim 1,
   wherein an inside and an outside of the waveguide are formed of different materials, and a difference between a refractive index of the material of the inside and a refractive index of the material of the outside is equal to or greater than 0.2.

6. The focus detection apparatus according to claim 1,
   wherein the waveguides are configured to include reflective plates that reflect light which is incident at a predetermined angle or greater.

7. The focus detection apparatus according to claim 6,
   wherein microlenses that are arranged on the waveguides are configured to have lower lens power than microlenses that are not arranged on the waveguides.

8. The focus detection apparatus according to claim 6,
   wherein a difference in the refractive indexes of the materials which form the reflective plates is equal to or greater than 0.2.

9. An electronic apparatus comprising:
   microlenses;
   photodiodes that receive light which is incident on the microlenses;
   asymmetrically shaped waveguides that cause light, which is incident on the microlenses at a predetermined incident angle, to be received by the photodiodes, wherein the waveguides are between the microlenses and the photodiodes;
   a detector that detects focusing using signals from the photodiodes which are provided with the waveguides; and
   a signal processor that performs signal processing on signals output from the photodiodes which are not provided with the waveguides.

10. A manufacturing apparatus which manufactures a focus detection apparatus comprising:
    microlenses;
    photodiodes that receive light which is incident on the microlenses;
    asymmetrically shaped waveguides that cause light, which is incident on the microlenses at a predetermined incident angle, to be received by the photodiodes, wherein the waveguides are between the microlenses and the photodiodes; and
    a detector that detects focusing using output values from the photodiodes.

11. The manufacturing apparatus according to claim 10,
    wherein the waveguides are manufactured by repeating a lithography process, a dry etching process, and a process of implanting materials which form the waveguides a plurality of times.

12. A method of manufacturing a focus detection apparatus, the apparatus including:
    providing microlenses;
    providing photodiodes that receive light which is incident on the microlenses;
    providing asymmetrically shaped waveguides that cause light, which is incident on the microlenses at a predetermined incident angle, to be received by the photodiodes, wherein the waveguides are between the microlenses and the photodiodes; and
    providing a detector that detects focusing using output values from the photodiodes.

13. The method according to claim 12,
wherein the waveguides are manufactured by repeating a lithography process, a dry etching process, and a process of implanting materials which form the waveguides a plurality of times.

14. The electronic apparatus according to claim 9,
wherein a portion of each waveguide includes a sloped side wall, wherein the slope of the side wall is based on a light reception angle.

15. The electronic apparatus according to claim 9,
wherein for at least two continuous photodiodes, a waveguide is provided for each photodiode of the at least two continuous photodiodes, and a light shield film is provided between the waveguides.

16. The electronic apparatus according to claim 15,
wherein the microlenses are arranged at locations that are disposed over the continuous photodiodes.

17. The electronic apparatus according to claim 9,
wherein an inside and an outside of the waveguide are formed of different materials, and a difference between a refractive index of the material of the inside and a refractive index of the material of the outside is equal to or greater than 0.2.

18. The electronic apparatus according to claim 9,
wherein the waveguides are configured to include reflective plates that reflect light which is incident at a predetermined angle or greater.

19. The electronic apparatus according to claim 18,
wherein microlenses that are arranged on the waveguides are configured to have lower lens power than microlenses that are not arranged on the waveguides.

20. The electronic apparatus according to claim 18,
wherein a difference in the refractive indexes of the materials which form the reflective plates is equal to or greater than 0.2.

* * * * *